United States Patent
Kawasaki et al.

(10) Patent No.: US 8,580,652 B2
(45) Date of Patent: Nov. 12, 2013

(54) SEMICONDUCTOR DEVICE AND MANUFACTURING METHOD THEREOF

(75) Inventors: Atsuko Kawasaki, Yokohama (JP); Kenichiro Hagiwara, Yokohama (JP); Ikuko Inoue, Yokohama (JP); Kazutaka Akiyama, Matsudo (JP); Itsuko Sakai, Yokohama (JP); Mie Matsuo, Kamakura (JP); Masahiro Sekiguchi, Yokohama (JP); Yoshiteru Koseki, Kitakami (JP); Hiroki Neko, Kitakami (JP); Koushi Tozuka, Hanamaki (JP); Kazuhiko Nakadate, Yokohama (JP); Takuto Inoue, Kitakami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/875,628

(22) Filed: Sep. 3, 2010

(65) Prior Publication Data

US 2011/0068476 A1    Mar. 24, 2011

(30) Foreign Application Priority Data

Sep. 24, 2009   (JP) ................................. 2009-219736

(51) Int. Cl.
*H01L 29/78* (2006.01)
(52) U.S. Cl.
USPC ........... 438/435; 438/424; 438/270; 257/774; 257/E21.616; 257/E27.06
(58) Field of Classification Search
USPC .................. 438/435, 424; 257/774, E21.616, 257/E27.06
See application file for complete search history.

(56) References Cited

U.S. PATENT DOCUMENTS

| 6,489,675 | B1 | 12/2002 | Gruber et al. | |
|---|---|---|---|---|
| 7,994,641 | B2 * | 8/2011 | Inohara | 257/774 |
| 2009/0242980 | A1 * | 10/2009 | Inoue | 257/334 |
| 2010/0019387 | A1 * | 1/2010 | Miura | 257/773 |

FOREIGN PATENT DOCUMENTS

| JP | 10-223833 | 8/1998 |
|---|---|---|
| JP | 2005-268456 | 9/2005 |
| JP | 2009-64820 | 3/2009 |
| JP | 2009-76811 | 4/2009 |

OTHER PUBLICATIONS

"Nikkei Micro Devices", Apr. 1998, 6 pages.
H. Kurino et al., "Intelligent Image sensor Chip with Three Dimensional Structure", International Electron Devices Meeting, Technical Digest, 1999, 4 pages.
Office Action issued Jan. 10, 2012, in Japanese Patent Application No. 2009-219736 (with English-language translation).

* cited by examiner

*Primary Examiner* — S. V. Clark
*Assistant Examiner* — Krista Soderholm
(74) *Attorney, Agent, or Firm* — Oblon, Spivak, McClelland, Maier & Neustadt, L.L.P.

(57) ABSTRACT

According to one embodiment, a manufacturing method of a semiconductor device is disclosed. The semiconductor device includes a semiconductor substrate having first and second main surfaces, and a through hole passing through between the first and second main surfaces, a pad on the first main surface, a through electrode in the through hole, and a connection structure including a connection portion to directly connect the pad and the through electrode, and another connection portion to indirectly connect the pad and the through electrode. The method includes forming an isolation region in the first main surface, the isolation region being in a region where the through electrode is to be formed and being in a region other than the region where the through hole is to be formed, forming the pad, and forming the through hole by processing the substrate to expose a part of the pad.

10 Claims, 22 Drawing Sheets

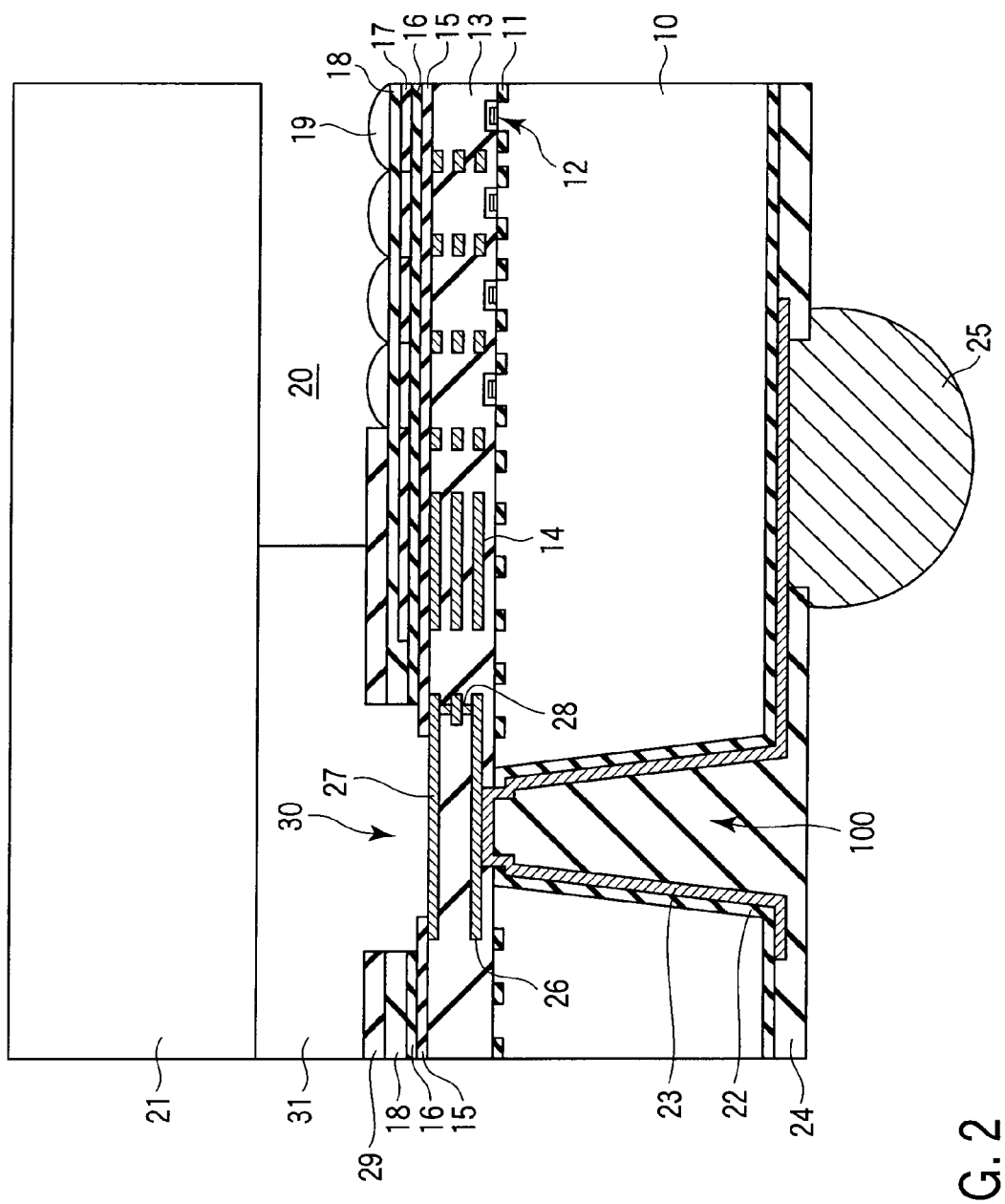
F I G. 2

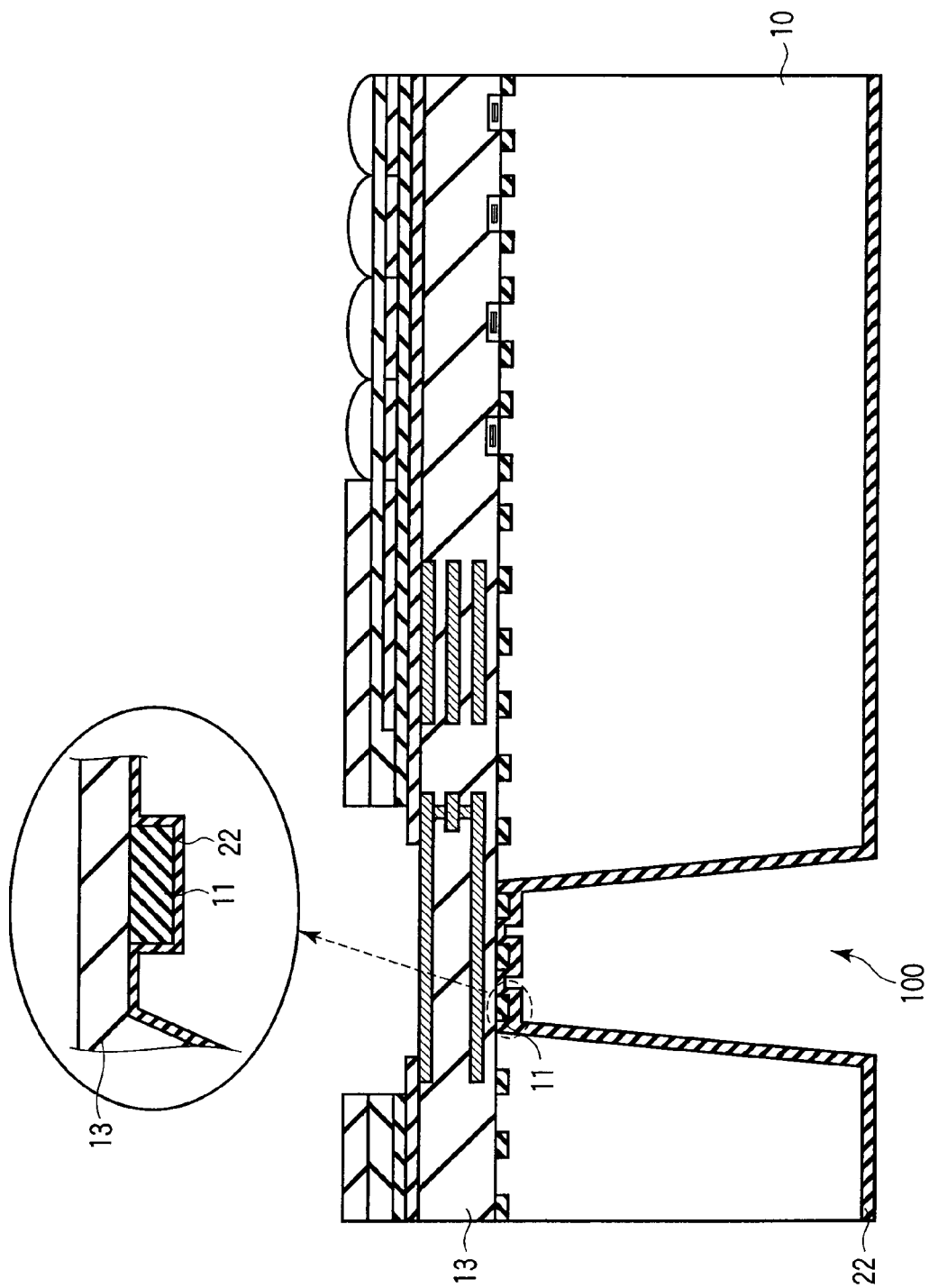
F I G. 14

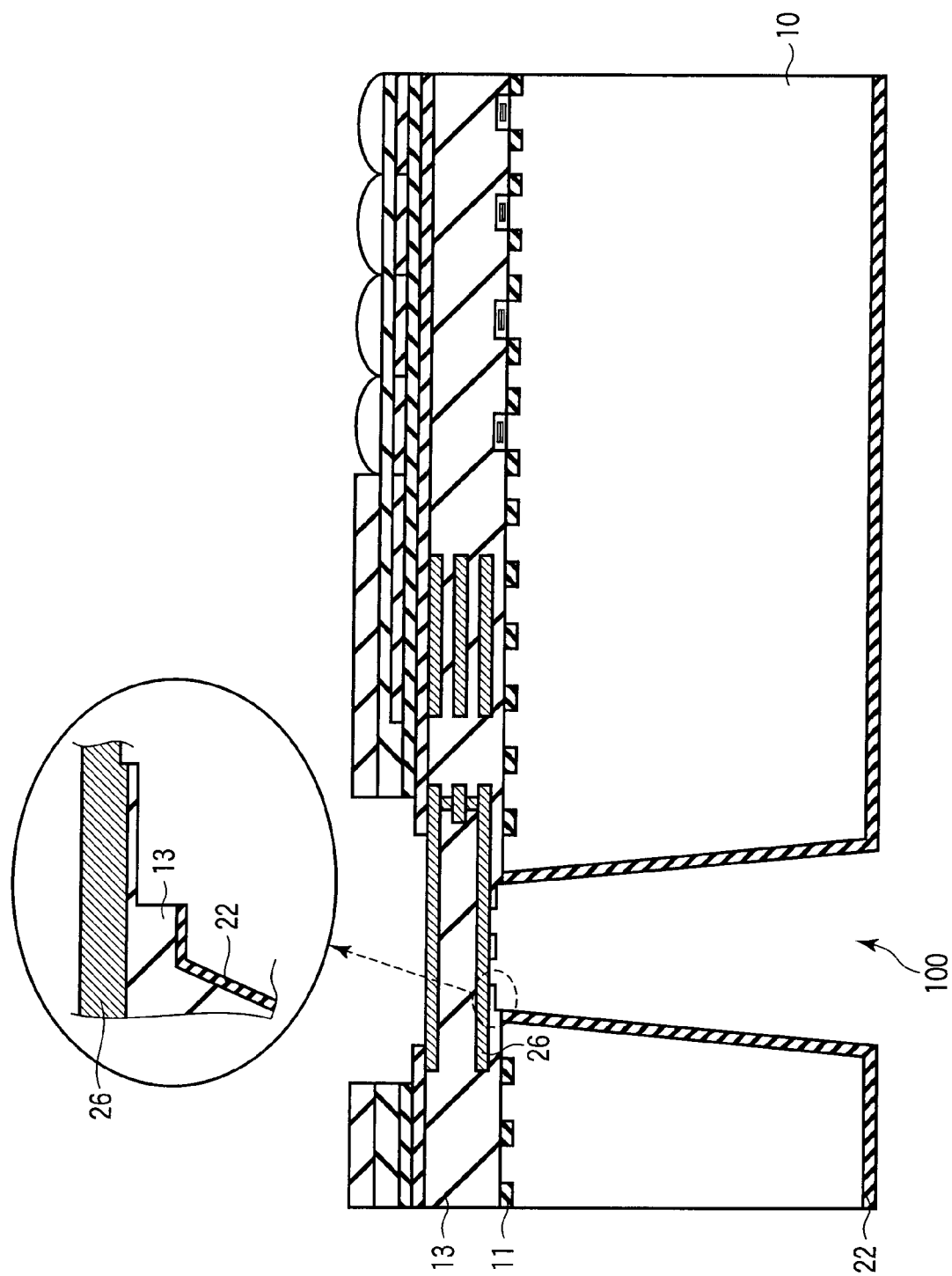
F I G. 15

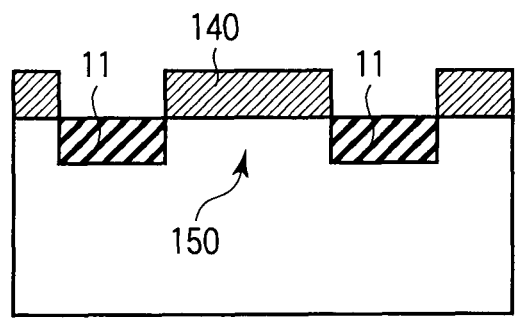
F I G. 22
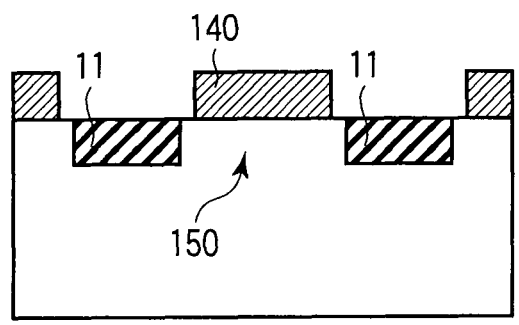
F I G. 23

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2009-219736, filed Sep. 24, 2009; the entire contents of which are incorporated herein by reference.

FIELD

Embodiments described herein relate generally to a semiconductor device and manufacturing method thereof

BACKGROUND

With scale reduction of electronic apparatuses, a semiconductor device built therein requires miniaturization and high integration. In the second half of the year of 1990, the study of the practical use of a wafer level chip scale package (WLCSP) has been begun. The WLCSP is a chip size package (CSP) formed by the following method. According to the method, terminals and interconnects are formed before a chip is cut out of a wafer, and thereafter, the chip is cut out of the wafer.

On the other hand, the development of a stacked package (multichip package) has been made from the second half of the year of 1990. According to the stacking package, a plurality of semiconductor chips is three-dimensionally stacked; therefore, considerable miniaturization is realizable. A package using a through electrode has been proposed as this kind of stacking package.

In optical devices, the study of the WLCSP has begun around the year of 2000. A structure of glass+bonding layer+ image sensor+through electrode, or a structure of an optical device including a through electrode and a light transmission support substrate is known. The technique using the electrode structure is called as through chip via (TCV) or through Si via (TSV).

According to the conventional TCV, in order to firmly connect a through electrode and an electrode pad connected thereto and to simplify the process, the shape for connecting the through electrode with the electrode pad has a simple serial structure.

BRIEF DESCRIPTION OF THE DRAWINGS

FIG. 2 is a cross-sectional view enlarging a silicon substrate and a glass substrate in a camera module;

FIG. 14 is a cross-sectional view following FIG. 13 to explain a method of manufacturing a semiconductor device according to a fourth embodiment;

FIG. 15 is a cross-sectional view following FIG. 14 to explain a method of manufacturing a semiconductor device according to a fourth embodiment;

FIG. 22 is a cross-sectional view showing one example of the arrangement relationship between a dummy gate electrode and a dummy STI according to a fifth embodiment;

FIG. 23 is a cross-sectional view showing another example of the arrangement relationship between a dummy gate electrode and a dummy STI according to a fifth embodiment;

DETAILED DESCRIPTION

First Embodiment

In general, according to one embodiment, a semiconductor device is disclosed. A semiconductor device includes a semiconductor substrate having a first main surface, a second main surface opposing the first main surface, and a through hole passing through between the first main surface and the second main surface. The semiconductor device further includes an electrode pad provided on the first main surface, a through electrode provided in the through hole, and a connection structure provided on the first main surface side of the through hole. The connection structure includes a first connection portion configured to directly connect the electrode pad and the through electrode, and a second connection portion configured to indirectly connect the electrode pad and the through electrode.

In one embodiment, a method for manufacturing the semiconductor device is disclosed. The semiconductor device includes a semiconductor substrate having a first main surface, a second main surface opposing the first main surface, and a through hole passing through between the first main surface and the second main surface; an electrode pad provided on the first main surface; a through electrode provided in the through hole; and a connection structure provided on the first main surface side of the through hole, the connection structure comprising a first connection portion configured to directly connect the electrode pad and the through electrode, and a second connection portion configured to indirectly connect the electrode pad and the through electrode; The method includes forming an isolation region in the first main surface, the isolation region comprising an isolation insulating film filling a trench formed in the first main surface, and the isolation region being in a region where the through electrode is to be formed and being in a region other than the region where the through hole is to be formed; forming the electrode pad on the first main surface; forming the through hole by processing the semiconductor substrate, the forming the through hole comprising exposing a part of the electrode pad; and forming the through electrode in the through hole.

Second Embodiment

Figure 1:
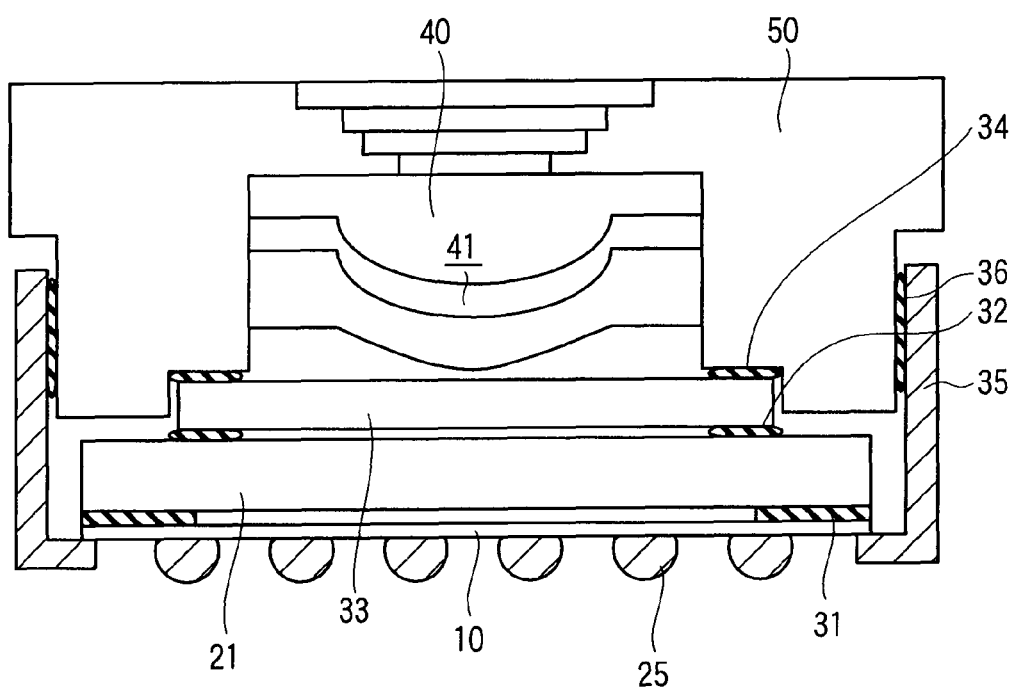
FIG. 1 is a cross-sectional view schematically showing the structure of a semiconductor device according to a second embodiment.

FIG. 1 is a cross-sectional view schematically showing the structure of a semiconductor device according to a second embodiment. This second embodiment relates to a semiconductor device including a camera module.

In FIG. 1, a reference numeral 10 denotes a silicon substrate. In the present embodiment, the silicon substrate 10 is given as a substrate (imaging device chip), on which an imaging device (not shown) is formed. The imaging device is a CMOS sensor or CCD sensor, for example. The first main surface (device formation surface) of the silicon substrate 10 is provided with a glass substrate 21 given as a light transmission support substrate (transparent substrate) via a bonding layer 31. The glass substrate 21 is provided with an IR glass 33 via a bonding layer 32. The IR glass 33 is covered with a lens holder 50 including an imaging lens 40 via a bonding layer 34.

As described above, the silicon substrate 10, glass substrate 21, IR glass 33 and lens holder 50 including the imaging lens 40 are bonded using bonding layers 31, 32 and 34; in this way, a camera module is formed. In FIG. 1, a reference numeral 41 denotes a cavity.

Moreover, the second main surface (opposing to the first main surface) is provided with a solder ball 25 functioning as an external terminal. The silicon substrate 10 and the glass substrate 21 are covered with a light and electromagnetic shield 35. The light and electromagnetic shield 35 is bonded to the lens holder 50 by means of a bonding layer 36.

FIG. 2 is a cross-sectional view enlarging a portion of the silicon substrate 10 and the glass substrate 21 in a camera module. The camera module includes an imaging pixel unit and a peripheral circuit unit configured to process a signal output from the imaging pixel unit.

The structure of the fore going imaging pixel unit will be explained below. An isolation insulating film 11 (isolation region) for shallow trench isolation (STI) and a device region (active area) partitioned by the isolation insulating film 11 are arranged. An imaging device 12 is provided on the device region. The imaging device 12 includes a photodiode and a transistor. An interlayer insulating film 13 is provided on the first main surface on which the imaging device 12 is provided. A multilayer interconnect 14 is formed in the interlayer insulating film 13. This interlayer insulating film 13 is actually a multilayer insulating film; in this case, it is shown as a single-layer insulating film in FIG. 2, for simplification.

A passivation film 15 is formed on the interlayer insulating film 13. A base layer 16 is formed on the passivation film 15. A color filter 17 is arranged on the base layer 16 to correspond to the imaging device 12. An overcoat 18 is formed on the color filter 17. A microlens 19 is formed on the overcoat 18 to correspond to the imaging device 12 (color filter 17). A cavity 20 is formed between the microlens 19 and the glass substrate 21.

The material of the each film and member is as follows. For example, the material of the isolation insulating film 11 is $SiO_2$. The material of the interlayer insulating film 13 is $SiO_2$ or SiN. The material of the interconnect 14 is aluminum (Al) or copper (Cu). The material of the color filter 17 is an acrylic resin. The material of the microlens 19 is a styrene resin.

The peripheral circuit unit of the camera module is provided with the following through electrode and internal electrode (electrode pad).

A through hole 100 is provided on the silicon substrate 10 of the peripheral circuit unit. The through hole 100 penetrates a portion between the first and second main surfaces of the silicon substrate 10.

The first main surface of the silicon substrate 10 is provided with an internal electrode (i.e., electrode pad) 26 via the interlayer insulating film 13. As described above, the interlayer insulating film 13 is formed of a multilayer insulating film (not shown). For example, the internal electrode 26 is formed on the first main surface of the silicon substrate 10 via the first-layer insulating film of the non-shown multilayer insulating film (interlayer insulating film 13). For example, the through hole 100 penetrates the first-layer insulating film, and then, reaches the lower surface (bottom portion) of the internal electrode 26.

For convenience, an opening of the through hole 100 on the side of the first main surface is referred to as a bottom surface while an opening thereof on the side of the second main surface is referred to as a top surface.

An insulating film 22 is provided on a side of the through hole 100 and on the second main surface of the silicon substrate 10. In detail, in the side of the through hole 100, a portion defined by the silicon substrate 10 is provided with the insulating film 22, but a portion defined by the interlayer insulating film 13 is not provided with the insulating film 22.

A through electrode 23 is provided on an inner surface (side surface and bottom surface) of the through hole 100. In detail, in the side of the through hole 100, a portion defined by the silicon substrate 10 is provided with the through electrode 23 via the insulating film 22. A portion defined by the interlayer insulating film 13 is directly provided with the through electrode 23. The structure of the through electrode at the bottom portion of the through hole 100 will be described later.

The through electrode 23 is formed on a partial area of the second main surface of the silicon substrate 10. The through electrode 23 on the area is used as a wiring.

According to the present embodiment, the through hole 100 is not filled with the through electrode 23; however, it may be filled with the through electrode 23.

According to the present embodiment, the through hole 100 is filled with a solder resist 24 given as a protective film formed on the through electrode 23. The solder resist 24 is formed on the through electrode 23 outside (on the side of the second main surface of) the through hole 100. For example, the material of the solder resist is a phenol resin, a polyimide resin and an amine resin.

The solder resist 24 of the through electrode 23 (interconnect) outside the through hole 100 is partially opened. The exposed through electrode 23 (interconnect) is provided with a solder ball 25. The material (solder) of the solder ball 25 is as follows. For example, Sn—Pb (eutectic) and 95 Pb—Sn (high-plumbum/high-melting-point solder) are given as a solder containing Pb, while Sn—Ag, Sn—Cu and Sn—Ag—Cu are given as a solder (free-solder) containing no Pb.

The internal electrode 26 is electrically connected to the imaging device 12 or a peripheral circuit (not shown) formed in the peripheral circuit unit. Further, the internal electrode 26 is electrically connected to the through electrode 23. Therefore, the solder ball 25 is electrically connected with the imaging device 12 or the peripheral circuit (not shown) by means of the internal electrode 26.

A device surface electrode 27 is formed above the internal electrode 26 via the interlayer insulating film 13. A contact plug 28 for electrically connecting the internal electrode 26 and the device surface electrode 27 is provided in the interlayer insulating film 13 between these electrodes 26 and 27. The device surface electrode 27 functions as an electrode pad, but differs from the internal electrode 26. Thus, the electrode 27 does not include a connection structure described later.

The device surface electrode 27 is used for voltage application and signal reading using the contact plug 28 and internal electrode 26. When a die sort test is made, a needle is put onto the device surface electrode 27. In this case, another electrode layer may be further interposed between the internal electrode 26 and the device surface electrode 27. Moreover, the internal electrodes 26 and the device surface electrode 27 may be provided as one electrode without providing these electrodes 26 and 27 independently from each other.

A passivation film 15 is provided on the interlayer insulating film 13. A base layer 16 is provided on the passivation film 15. An overcoat 18 is provided on the base layer 16. A styrene resin layer 29 is provided on the overcoat 18.

The passivation film 15, base layer 16 overcoat 18 and styrene resin layer 29 on the device surface electrode 27 are provided with a pad opening 30.

A bonding layer 31 is provided on the styrene resin layer and the device surface electrode 27 so that the pad opening 30 is filled with the boding layer 31. The bonding layer 31 is not provided on the imaging device 12 (microlens 19). That is, the bonding layer 31 has a pattern such that a cavity 20 is formed between the microlens 19 and the glass substrate 21.

Figure 3:
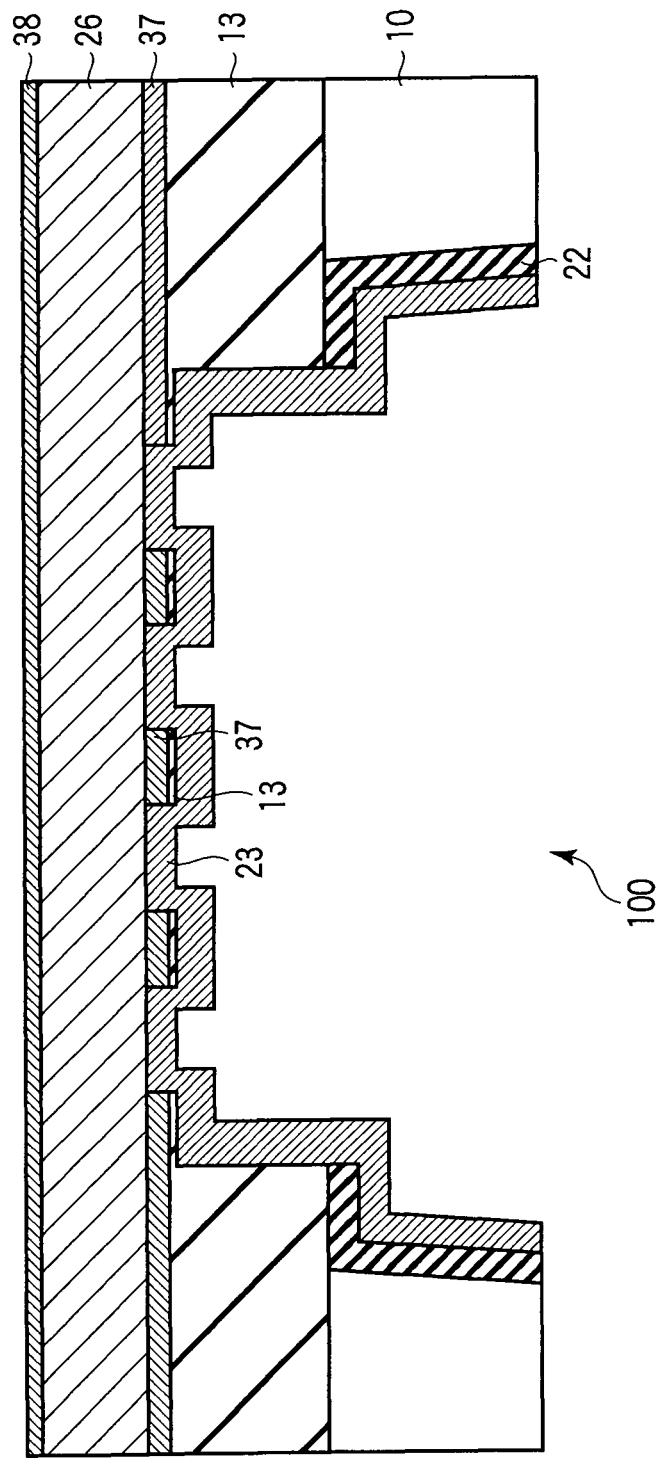
FIG. 3 is a cross-sectional view enlarging a bottom portion of a through hole according to a second embodiment.

The structure of the through electrode 23 and the internal electrode 26 in the bottom portion of the through hole 100 will be detailedly explained below. FIG. 3 is a cross-sectional view enlarging the bottom portion of the through hole 100.

The lower surface of the internal electrode 26 is provided with a protection internal electrode (protection electrode pad) 37 for protecting the internal electrode 26. For example, the protection internal electrode 37 is used for preventing corrosion of the internal electrode 26. Likewise, the upper surface of the internal electrode 26 is provided with a protection internal electrode 38 for protecting the internal electrode 26. As described above, according to the present embodiment, there is provided a stacked-layer internal electrode structure such that the internal electrode 26 exists on the center, and is held between protection internal electrodes 37 and 38.

The internal electrode 26 is formed of a low-resistance metal or metal compound. For example, metals containing Al, Cu, Ag, Au, Al—Cu or Al—Si—Cu as a main element are given as the low-resistance metal or metal compound. Moreover, protection internal electrodes 37 and 38 are formed of a high-corrosion resistant metal or compound. For example, metals containing Ti, Ta, TiN, TaN, WN2 or TiSiN are given as the high-corrosion resistant metal or compound.

In the bottom portion of the through hole 100, the through electrode 23 is needed to be electrically connected to the internal electrode 26. According to the present embodiment, the following connection structure is employed in order to connect the through electrode 23 with the internal electrode 26. As seen from FIG. 3, a part of the through electrode 23 is electrically connected (i.e., connection structure in which the through electrode 23 and the internal electrode 26 are directly connected). Moreover, a part of the through electrode 23 is not electrically connected (i.e., connection structure in which the through electrode 23 and the internal electrode 26 are indirectly connected).

A stacked structure formed of the interlayer insulating film 13 and the protection internal electrode 37 exists between the non-connected through electrode 23 and the internal electrode 26. The interlayer insulating film 13 on the non-connected through electrode 23 is thin.

The following conductive layers (not shown) may be formed outside the through electrode 23 (between the through electrode 23 and the through hole 100). For example, a thin-film layer of corrosion-resistant metal (e.g., Ti or Ta), a seed layer of the through electrode 23 (filling metal) or a stacked conductive layer of the thin-film layer and seed layer are given as the conductive layer.

Figure 4:
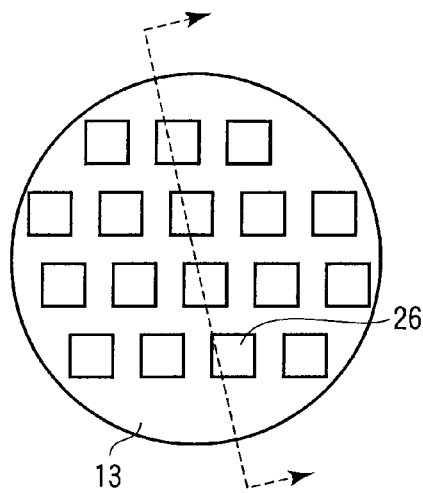
FIG. 4 is a top plan view showing a bottom portion of a through hole according to a second embodiment.

FIG. 4 is a top plan view showing a state of the bottom portion of the through hole 100 viewed from the top of the through hole 100 before the through electrode 23 is formed (if the conductive layer (not shown) exists, before the conductive layer and the through electrode 23 is formed). As seen from FIG. 4, the internal electrode 26 is seen in the part only of the bottom surface of the through hole, and the interlayer insulating film 13 is seen in areas other than the above areas.

Figure 6:
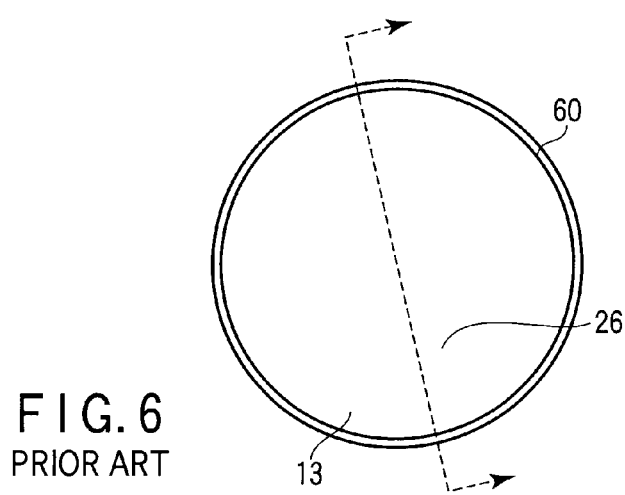
FIG. 6 is a top plan view showing a bottom portion of a conventional through hole.
Figure 5:
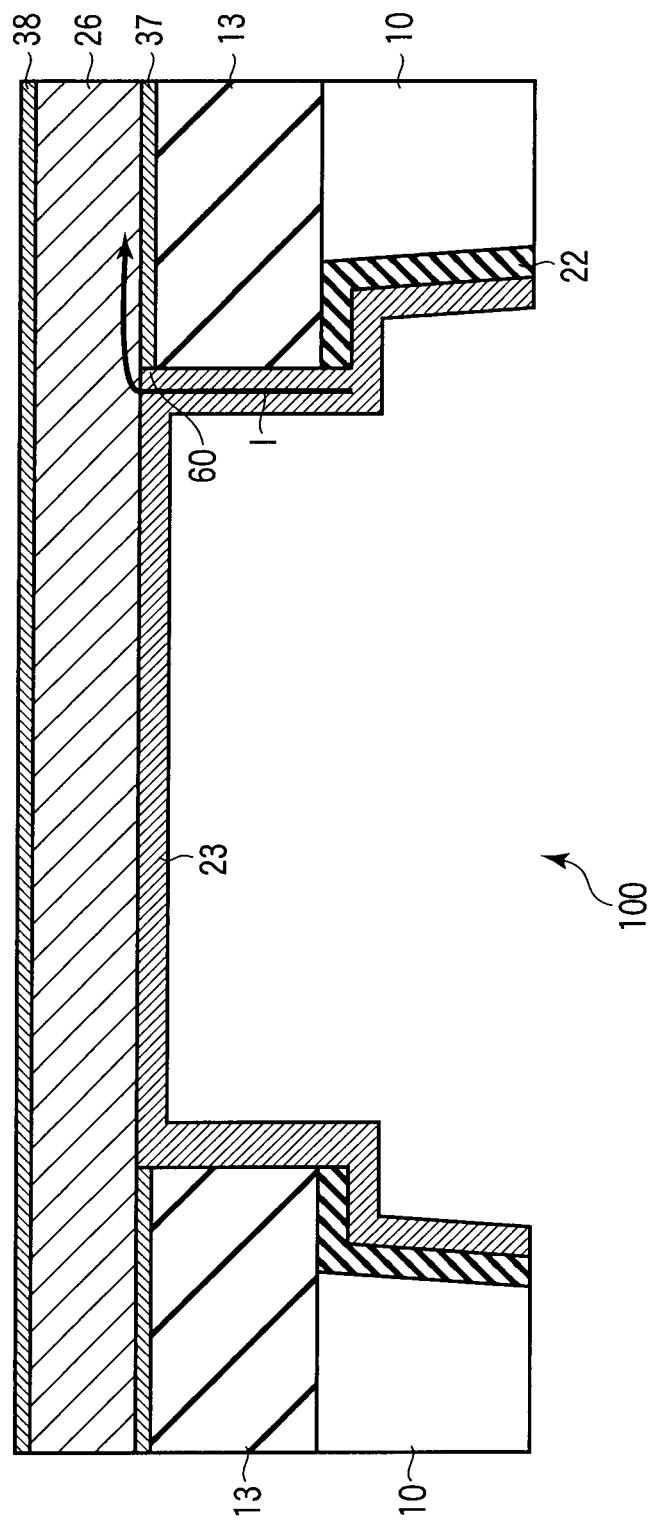
FIG. 5 is a cross-sectional view enlarging a bottom portion of a conventional through hole.

FIG. 5 and FIG. 6 show a through electrode and an internal electrode in the bottom surface of a conventional through hole. FIG. 5 and FIG. 6 correspond to FIG. 3 and FIG. 4, respectively, and the same reference numerals are used to designate portions corresponding to FIG. 3 and FIG. 4.

According to a conventional connection structure, the bottom portion of a through hole 100 is not provided with an interlayer insulating film. That is, in the bottom portion of the through hole 100, the whole bottom surface of the through electrode 23 is directly connected to the internal electrode 26.

In contrast to the conventional connection structure, according to the present embodiment, a part of the interlayer insulating film 13 and the protection internal electrode 37 of the bottom surface of the through hole 100 are intentionally left.

Third Embodiment

Figure 8:
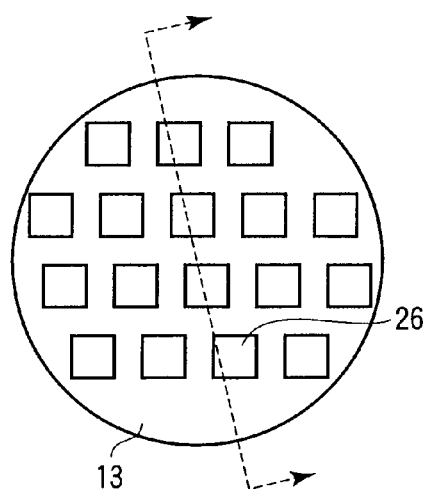
FIG. 8 is a top plan view showing a bottom portion of a through hole according to a third embodiment.
Figure 7:
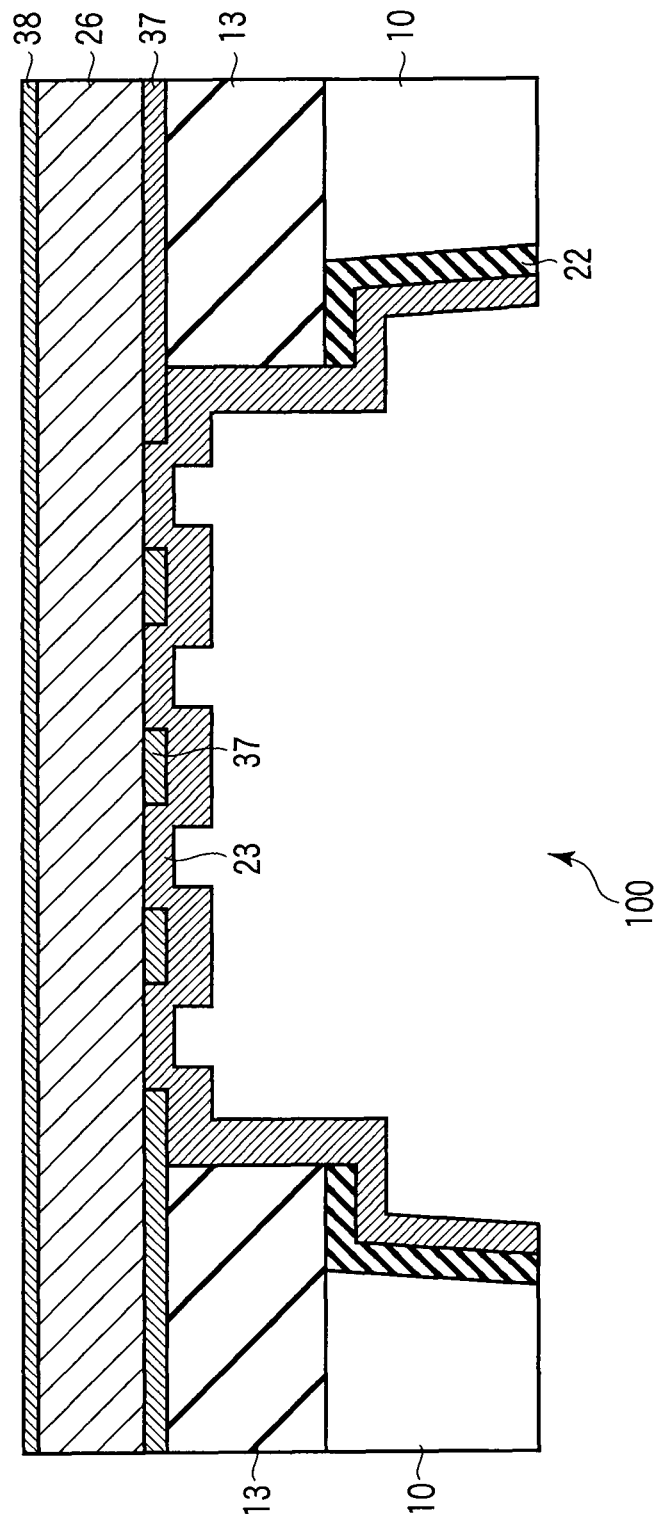
FIG. 7 is a cross-sectional view enlarging a bottom portion of a through hole according to a third embodiment.

FIG. 7 and FIG. 8 are a cross-sectional view and a top plan view to explain a third embodiment, and correspond to FIG. 3 and FIG. 4 of the second embodiment, respectively. Hereinafter, the same reference numerals are used to designate portions shown in FIG. 3 and FIG. 4, and the detailed explanation is omitted.

The third embodiment differs from the second embodiment in the following point. According to the second embodiment, the connection structure indirectly connecting the through electrode 23 with the internal electrode 26 has a stacked layer of the interlayer insulating film 13 and the protective internal electrode 37. According to this third embodiment, the connection structure has a single-layer formed of a protection internal electrode 37.

Fourth Embodiment

Figure 9:
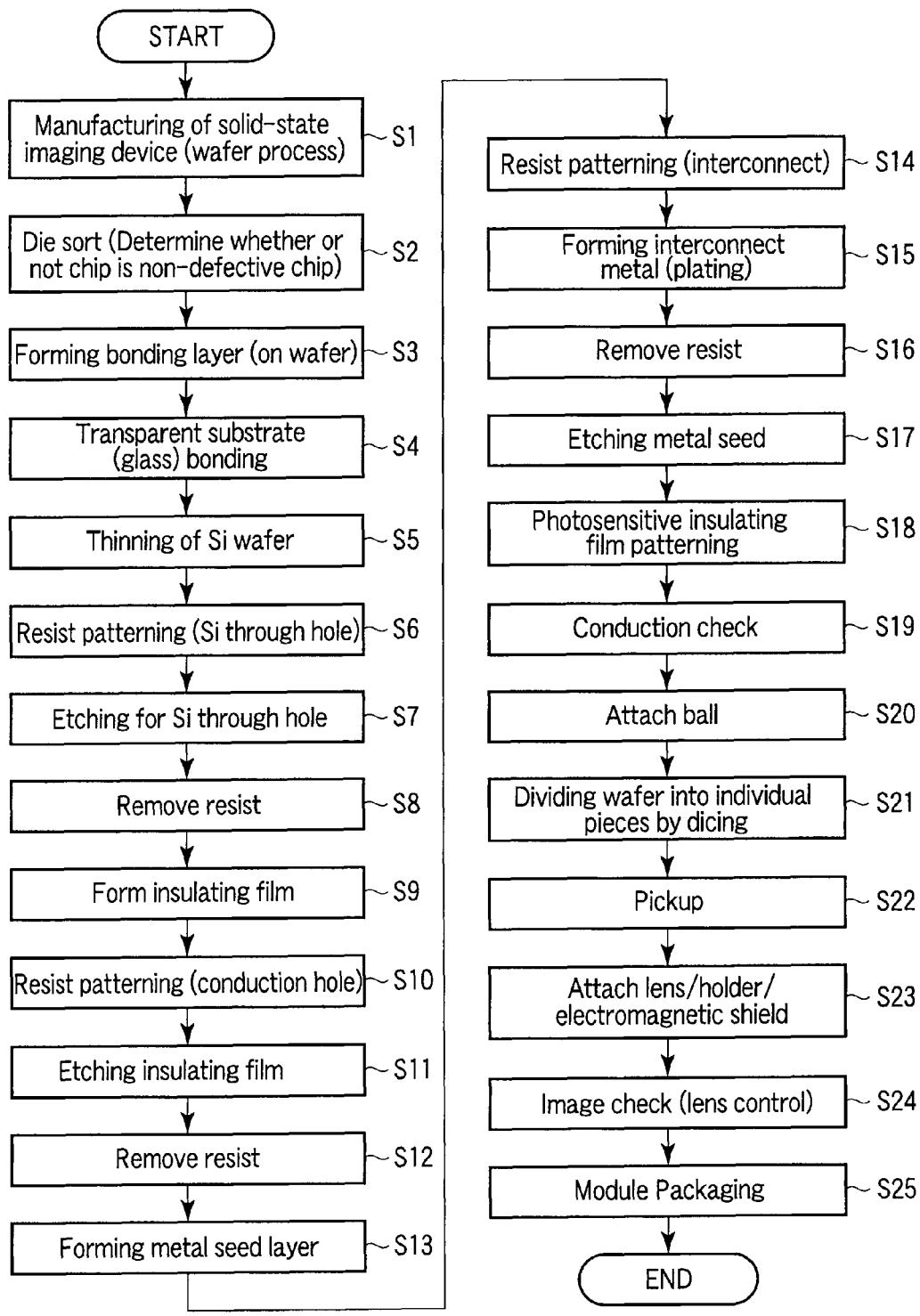
FIG. 9 is a process flow representing a method of manufacturing a semiconductor device according to a fourth embodiment.

FIG. 9 is a process flow representing a method of manufacturing a semiconductor device according to a fourth embodiment. FIG. 10 to FIG. 21 is cross-sectional views to explain the method.

Figure 10:
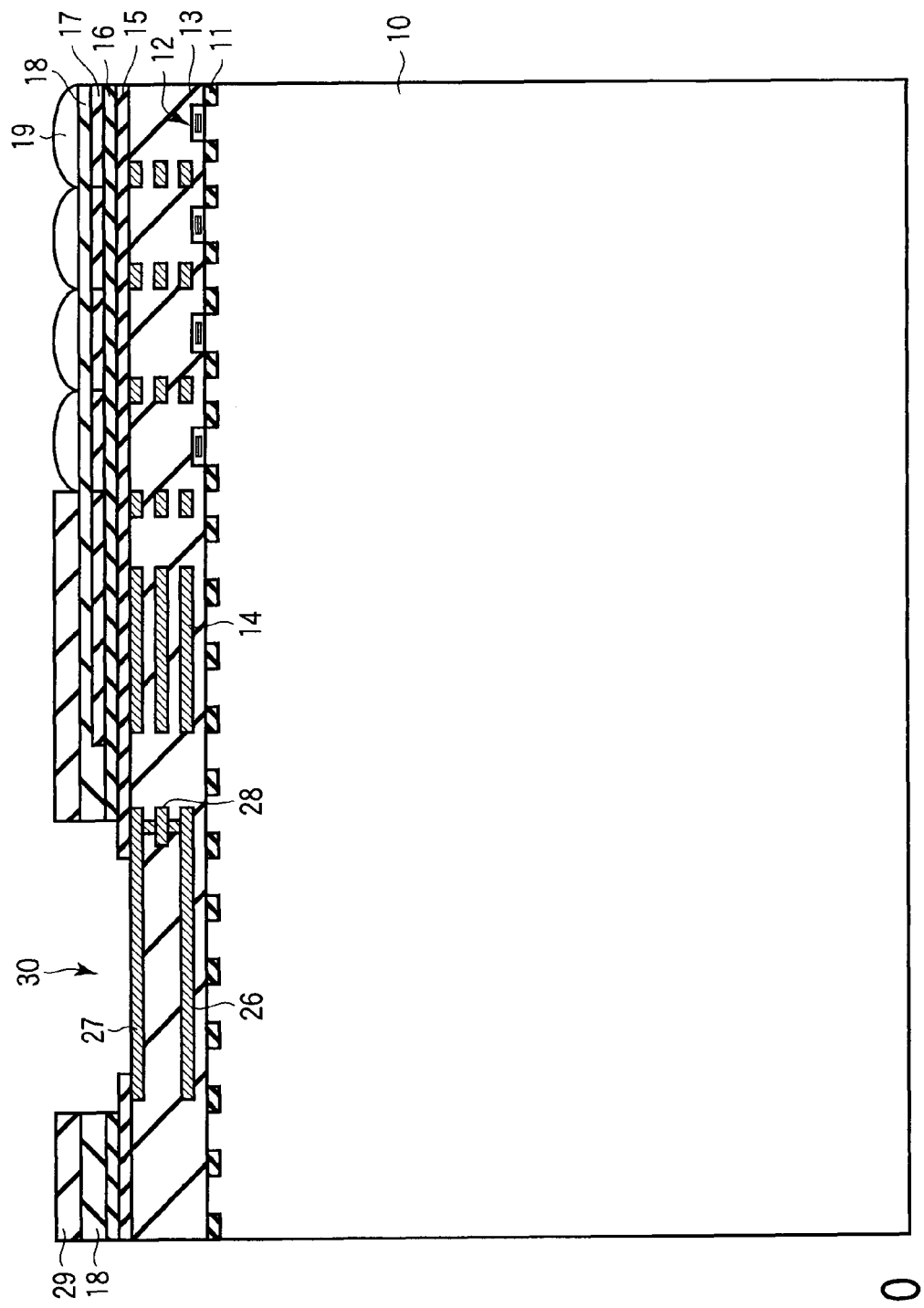
FIG. 10 is a cross-sectional view to explain method of manufacturing a semiconductor device according to a fourth embodiment.

[FIG. 10, Step S1]

An isolation insulating film (STI) 11 is formed inn the surface of a silicon substrate (wafer) 10. Concretely, an isolation trench is formed in the surface of the silicon substrate 10, and an insulating film (here, $SiO_2$ film) to be processed into the STI 11 is formed on the entire surface so that the isolation trench is filled with the insulating film. Then, the insulating film except the isolation trench is removed by CMP (chemical mechanical polishing) process while the surface is planarized.

When the STI is formed, it is inhibited to form a silicon hill having a predetermined size or more (silicon portion of active area) and a shallow trench having a predetermined size or more (CMP rule). The reason is as follows.

In the CMP process, the silicon hill having a predetermined size or more causes CMP residual on the hill. In addition, in the CMP process, the shallow trench having a predetermined size or more causes over-polishing in the trench. The CMP residual and over-polishing may cause problems such as a misalignment in the following lithography process and a disconnection of metal interconnect in the upper-layer.

However, in a case of forming the through electrode, even if the CMP rule is violated, it is important to put no dummy STI under the internal electrode (electrode pad) 26 on which the through electrode is to be contacted. Thereby, it is possible to connect the electrode pad with the through electrode over a wide area with high adhesion.

If the CMP residual is generated under the internal electrode (electrode pad) 26 when the STI is formed in a state of breaking the CPM rule, the following method is employed. According to the method, the CMP is carried out after removing a portion to have the residual. The portion is removed by forming a resist having an opening aligned with the portion by lithography process and by carrying out wet etching using the resist as a mask. In this way, the CMP residual is removed.

In a case of a CMOS logic circuit of a peripheral circuit, it is possible to break the CMP rule by limiting an area down to a design of about 100 nm when a degree of scale reduction of device is represented by minimum processing dimension.

However, if the scale reduction of devices will further advance in future, it is anticipated that it is impossible to break the CMP rule. The following problems are given as one of the reason. If a large STI and a large active area are formed in a state of breaking the CPM rule, a misalignment is generated around the SIT and active area in the subsequent lithography process. Moreover, there is a possibility of causing a distortion of a logic circuit and a disconnection at a step around the through electrode.

Therefore, according to the present embodiment, a STI shape (dummy STI) for preventing the break of CMP rule, is located even under the electrode pad. Instead, a repetition of control gate poly-Si which is a control gate electrode formed of polycrystalline silicon (dummy GC) may be located. Thereby, it is possible to realize a method of manufacturing a semiconductor device including the through electrode, which is adaptable to the scale reduction of device in future.

A solid-state imaging device including an imaging device 12 is manufactured by known method on the silicon substrate 10 (wafer process). The imaging device 12 includes a photodiode and a transistor, which are formed on the silicon substrate 10.

An interlayer insulating film 13, interconnection 14, passivation film 15, base layer 16, color filter 17, overcoat 18, microlens 19, internal electrode 26, device surface electrode 27, contact plug 28, styrene resin layer 29 and pad opening 30 are formed on the silicon substrate 10 using a known method.

[FIG. 10, Step S2]

A die sort test is carried out with respect to each chip including the imaging device 12, and then, a check is made whether or not each chip is normally operated.

Figure 11:
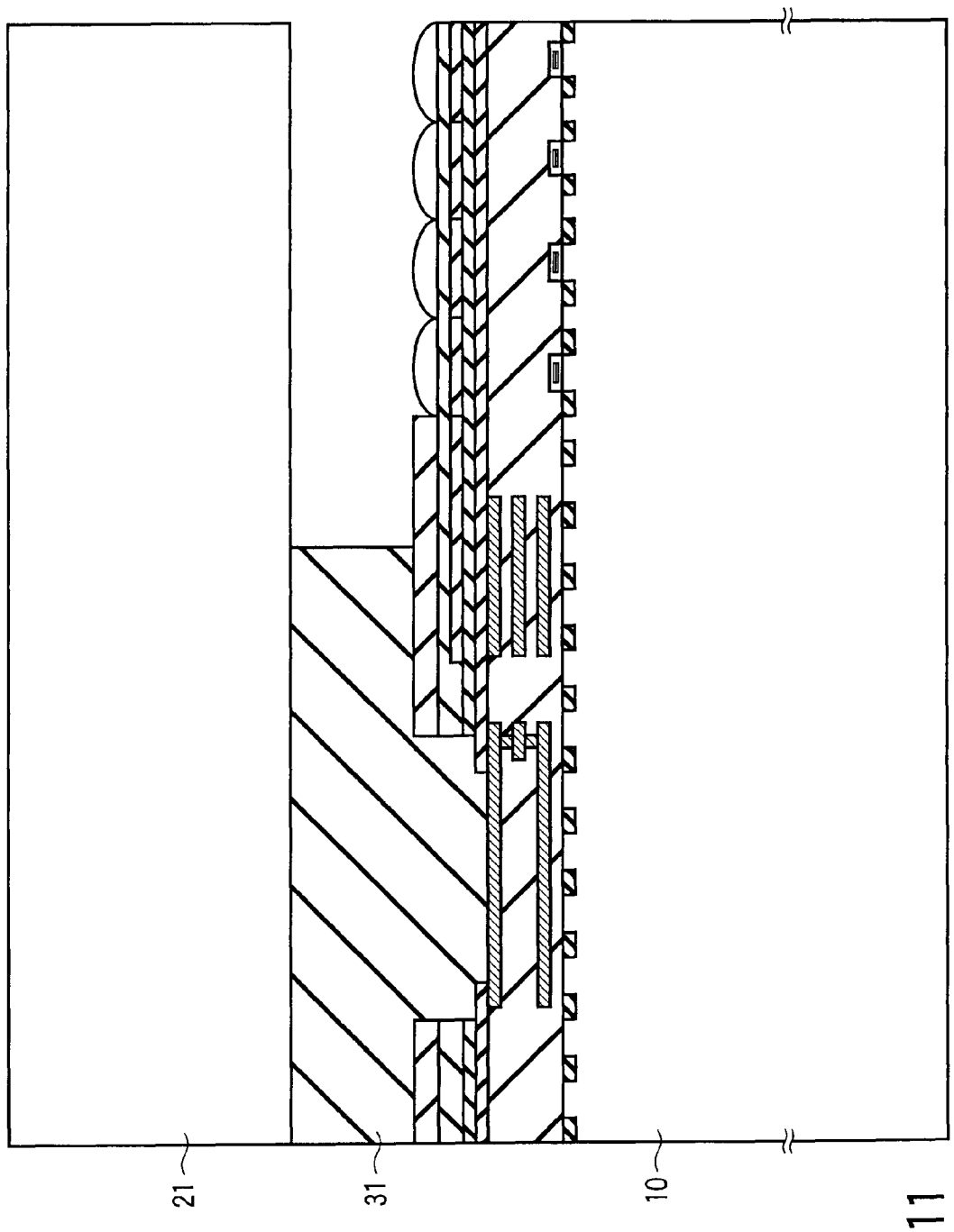
FIG. 11 is a cross-sectional view following FIG. 10 to explain a method of manufacturing a semiconductor device according to a fourth embodiment.

[FIG. 11, Steps S3 and S4]

As a result of the check, if it is determined that each chip is normally operated, the forming process is carried out. A bonding layer 31 is formed on the first main surface (device formation surface) of the silicon substrate 10. The silicon substrate 10 and a glass substrate 21 are bonded by the bonding layer 31.

The process of forming the bonding layer 31 includes the following steps. One is a step of forming a bonding agent on the first main surface (device formation surface) of the silicon substrate 10 using spin coating or a laminating process. The other is a step of patterning the bonding agent using lithography process (step of removing the bonding agent on the imaging device 12). The bonding agent has a bonding function, a function capable of being patterned by lithography process and a function of keeping the patterned shape.

Conversely, as a result of the check, if it is determined that each chip is not normally operated, a known repairing process is carried out.

In the following FIG. 12 to FIG. 22, the bonding layer 31 and glass substrate 21 are omitted.

Figure 12:
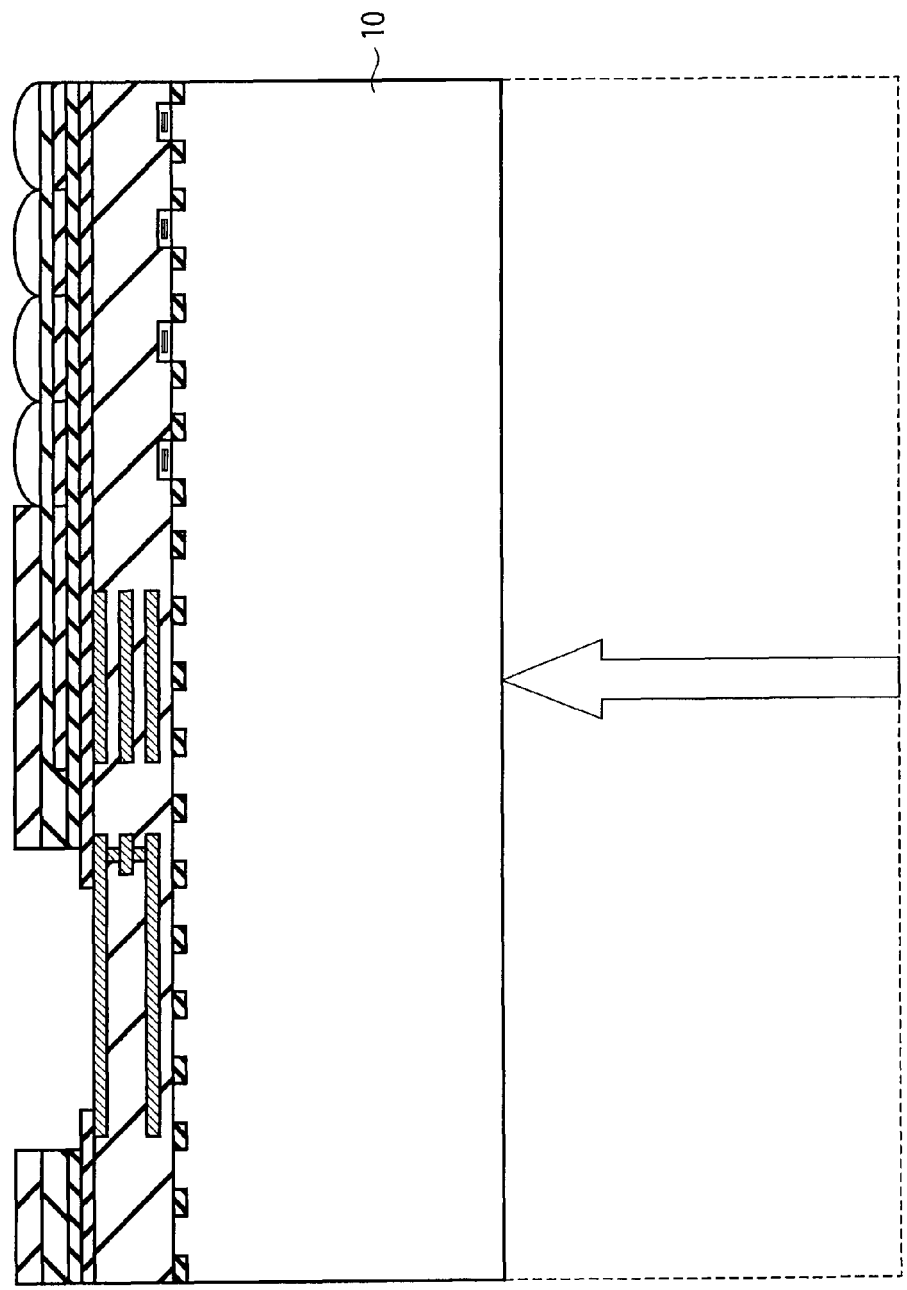
FIG. 12 is a cross-sectional view following FIG. 11 to explain a method of manufacturing a semiconductor device according to a fourth embodiment.

[FIG. 12, Steps S5]

The silicon substrate (Si wafer) 10 is ground from the second main surface using back grinding so that it is thinned into a silicon substrate 10 having a predetermined thickness.

Here, a ground residual is remained on the silicon surface after the back grinding, and the silicon surface has a concavo-concave portion ranging from several μm to 10 μm. If the subsequent lithography and RIE processes are carried out with the concavo-concave portion being left on the silicon surfaces, there is a possibility of causing lithography degradation and RIE degradation.

Hence, it is advisable for the surface of the second main silicon substrate 10 to be planarized by CMP or wet etching after the silicon substrate 10 is ground and thinned by back grinding.

Figure 13:
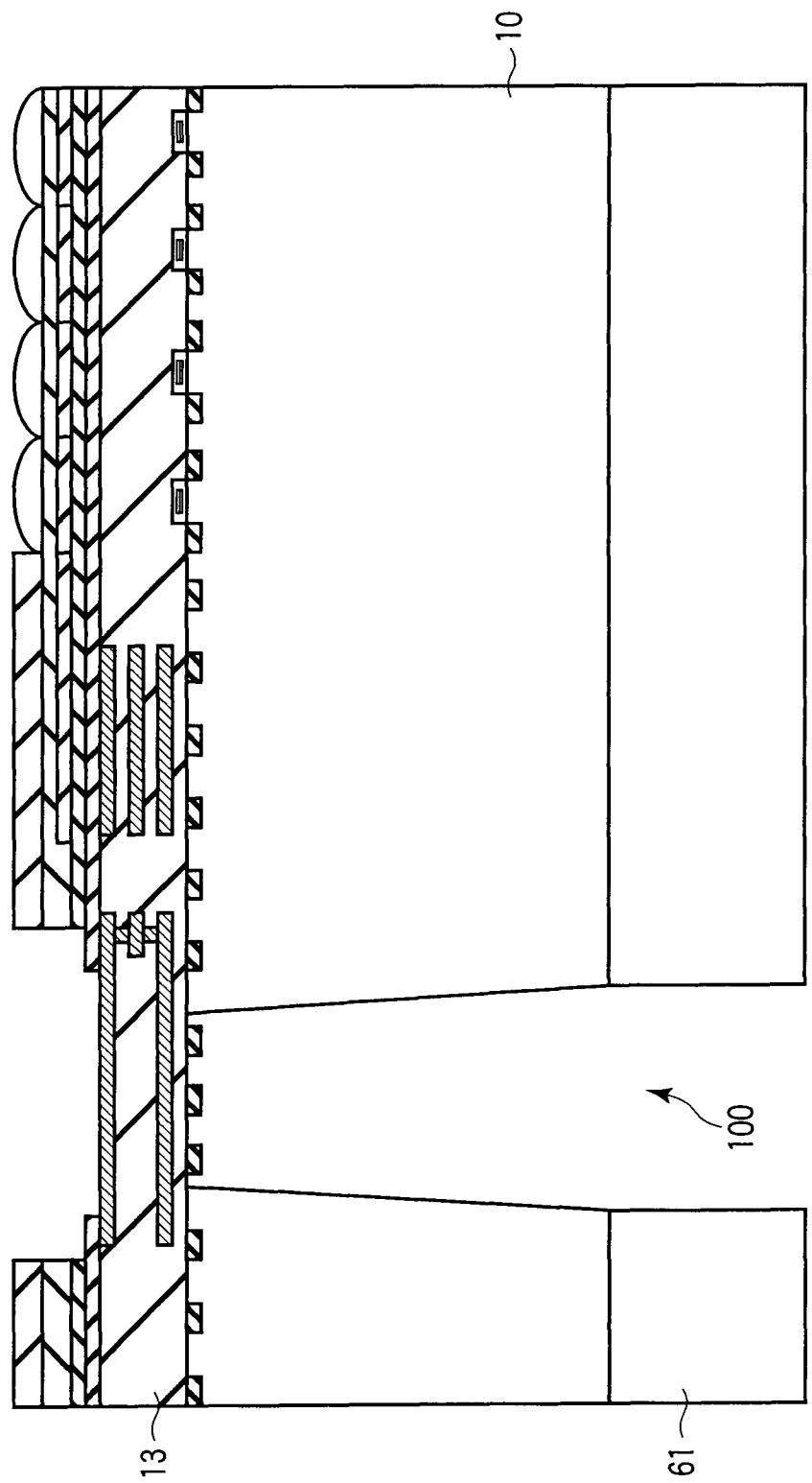
FIG. 13 is a cross-sectional view following FIG. 12 to explain a method of manufacturing a semiconductor device according to a fourth embodiment.

[FIG. 13, Steps S6]

A through hole (Si through hole) 100 is formed in a portion of the silicon substrate 10. The portion corresponds to the pad opening 30 of the first main surface of the silicon substrate 10. The process for forming the through hole 100 is started from the second main surface of the silicon substrate 10.

The through hole may be formed by laser or by etching using a resist pattern as a mask In a case of using the laser, for example, two-step processing of high-speed/low-speed is used to prevent generation of an opening which penetrates the internal electrode 26.

In a case where the resist pattern is formed, an apparatus (means) such as a double-sided aligner or a double-sided stepper is used, since an opening of the resist is to be aligned with an alignment mark (not shown) on the first main surface.

On the one hand, in a case where dry etching is used, a source gas satisfying the following etching rates is used. The etching rate of silicon is sufficiently higher than the etching rate of insulator such as an oxide or a nitride. This is based on the following reason. An insulating layer (not shown) directly contacted with the silicon substrate 10 in the interlayer insulating film 13 and a gate insulating film (not shown) formed on the silicon substrate 10 easily function as a silicon etching stopper when the through hole 100 is formed, and the silicon substrate 10 is selectively etched.

Moreover, the through hole may be formed by using both laser and dry etching. First, laser is used to form a hole reaching intermediate depth of the silicon substrate 10, then dry etching is used to selectively etch the silicon substrate 10 to deepen the hole until the through hole is formed.

The through hole 100 may have a vertical shape, though it is advisable that the through hole 100 has a taper shape, which is gradually narrowed toward the depth from the opening of the second main surface. The reason is because it is easy to uniformly form an insulating film 22 by subsequent CVD (chemical vapor deposition) process and to uniformly form a metal seed layer by subsequent sputtering.

[FIG. 14, Step S7]

When a resist pattern exists, the resist pattern is removed by asking and wet cleaning. Here, amount of RIE residuals is effectively reduced by performing HF wet cleaning after the RIE of the silicon substrate 10 or after the removal of the resist pattern.

Then, an insulating film 22 is formed on the inner surface (side surface, bottom surface) of the through hole and on the entire second main surface by CVD process (step S7). The material of the insulating film 22 is, for example, $SiO_2$, SiN, SiC, SiCN, SiOC, SiOCH or SiON. In FIG. 14, a detailed cross-sectional view enlarging an area surrounded by a broken line is shown above therein (same applies to FIG. 16 to FIG. 22).

The bottom surface of the through hole 100 includes a portion only of the insulating film 22 and a stacked portion of a dummy STI 11 and the insulating film 22. Therefore, the bottom surface of the through hole 100 has a concavo-convex structure made of insulating films. The convex portion is a thin insulator portion made of the insulating film 22 only. The concave portion is a thick insulator portion made of the stacked layer of the dummy STI 11 and the insulating film 22 (a portion whose insulating film thickness is thicker by dummy STI 11).

[Step S8]

Then, the second main surface of the silicon substrate 10 is again coated with a resist, and the resist on the area corresponding to the bottom portion of the though hole 100 is opened by lithography.

[Step S9]

The insulating film 22, dummy STI 11 and interlayer insulating film 13 are etched by RIE process. In the RIE process, the source gas, which enables the etching rate of the insulating films 22, 11 and 13 to be sufficiently higher than that of an internal electrode, is used.

The interlayer insulating film 13 corresponding to the convex portion of the concavo-convex structure (portion of insulating film 22 only) is exposed faster than the interlayer insulating film 13 corresponding to the concave portion of the concavo-convex structure (the stacked portion of dummy STI 11 and insulating film 22). Therefore, by controlling etching time of RIE, the following two structures are selectable. One is the connection structure of FIG. 3 (both interlayer insulating film 13 and protection internal electrode 37 are left on the concave portion). The other is the connection structure of FIG. 7 (protection internal electrode 37 only is left on the concave portion). The etching time required for forming the connection structure of FIG. 3 requires is shorter that of the connection structure of FIG. 7.

[FIG. 15, Steps S10 and S11]

The resist is removed by using ashing and wet cleaning (step S10).

A first metal seed layer (not shown) for forming a conductive layer (through electrode, interconnects) by plating is formed on the insulating film 22 and internal electrode 26 by sputtering. Thereafter, a second metal seed layer (not shown) for forming the conductive layer by plating is formed on the first metal seed layer via the interlayer insulating film by sputtering (step S11). For example, a Ti layer or Cu layer is given as the first and second metal seed layers.

Here, it is possible to effectively prevent increasing of resistance at the through electrode, if an oxide layer formed on the surface of the internal electrode 26 is removed before forming the first metal seed layer. The oxide layer is removed, for example, by reverse sputtering.

Figure 16:
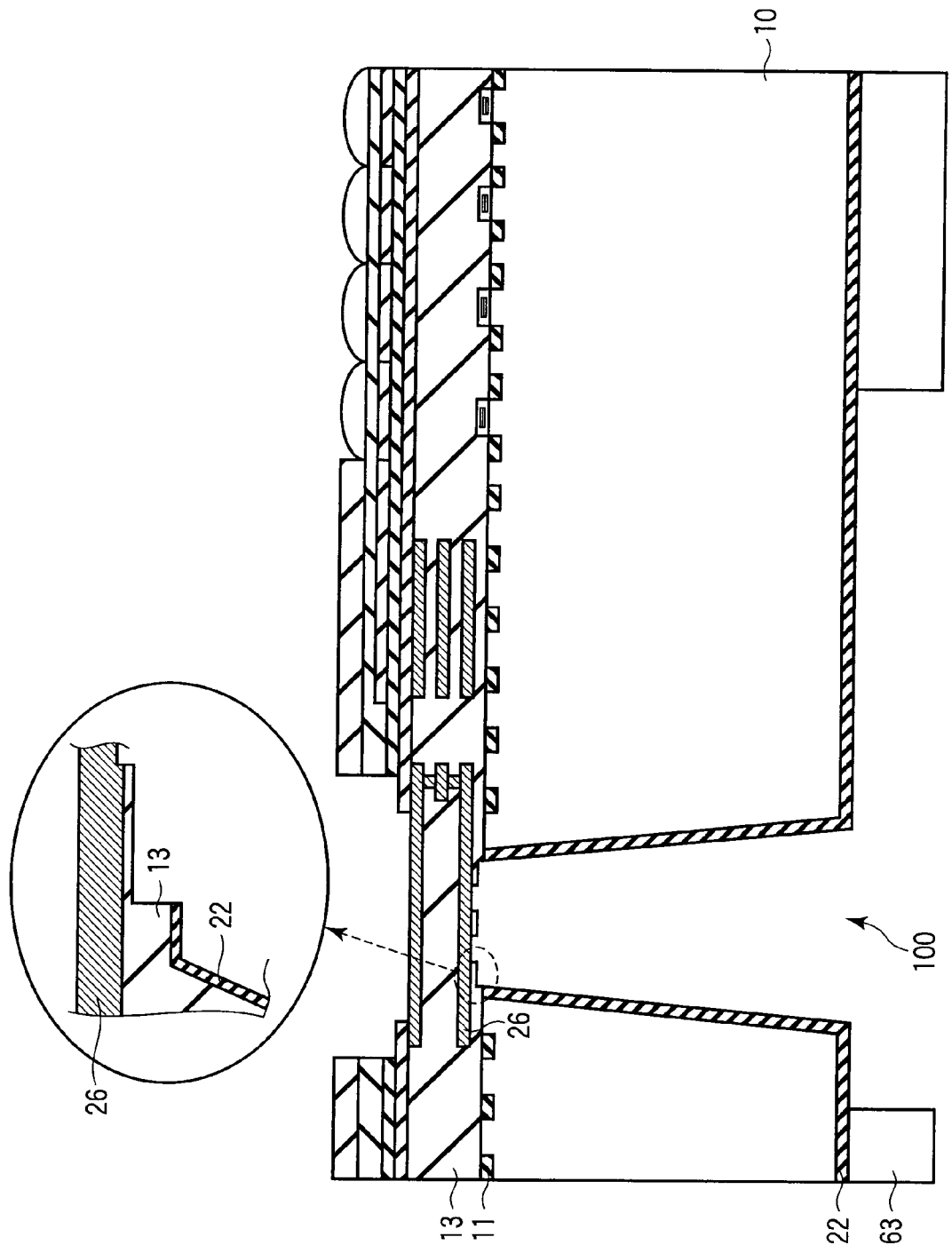
FIG. 16 is a cross-sectional view following FIG. 15 to explain a method of manufacturing a semiconductor device according to a fourth embodiment.

[FIG. 16, Step S12]

The second main surface of the silicon substrate 10 and the inner surface of the through hole 100 are coated with a resist. Then, patterning is carried out by using lithography process so that the resist is left only on a region where the through electrode and interconnects are not formed, and a resist pattern 63 is formed (step S12).

Figure 17:
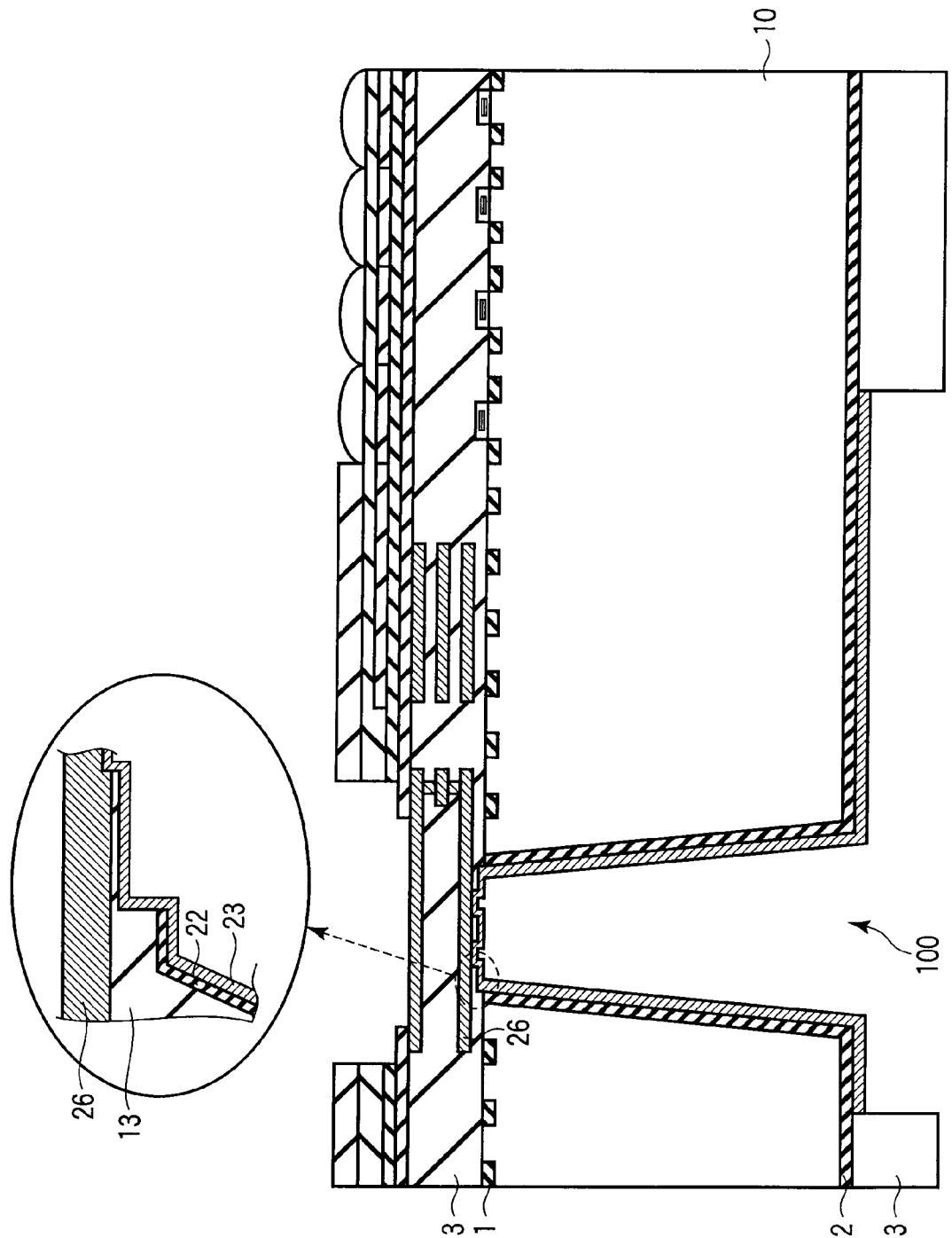
FIG. 17 is a cross-sectional view following FIG. 16 to explain a method of manufacturing a semiconductor device according to a fourth embodiment.

[FIG. 17, Step S13]

The first and second seed layers are plated using electrolytic plating to form a conductor layer (through electrode and interconnect) 23 (step S13).

In this way, the connection structure is obtained, which includes the through electrode 23 and the internal electrode 26, and the electrodes 23 and 26 are connected in a part of the bottom surface of the through hole 100, not the whole of the bottom surface of the through hole 100.

The through electrode and interconnection may be formed by following process. First, a conductive layer to be processed into the through electrode and the interconnection is formed, before performing the electrolytic plating to the entire surface. Then, the conductive layer is processed to form the through electrode and the interconnection, by using lithography and etching processes.

Figure 18:
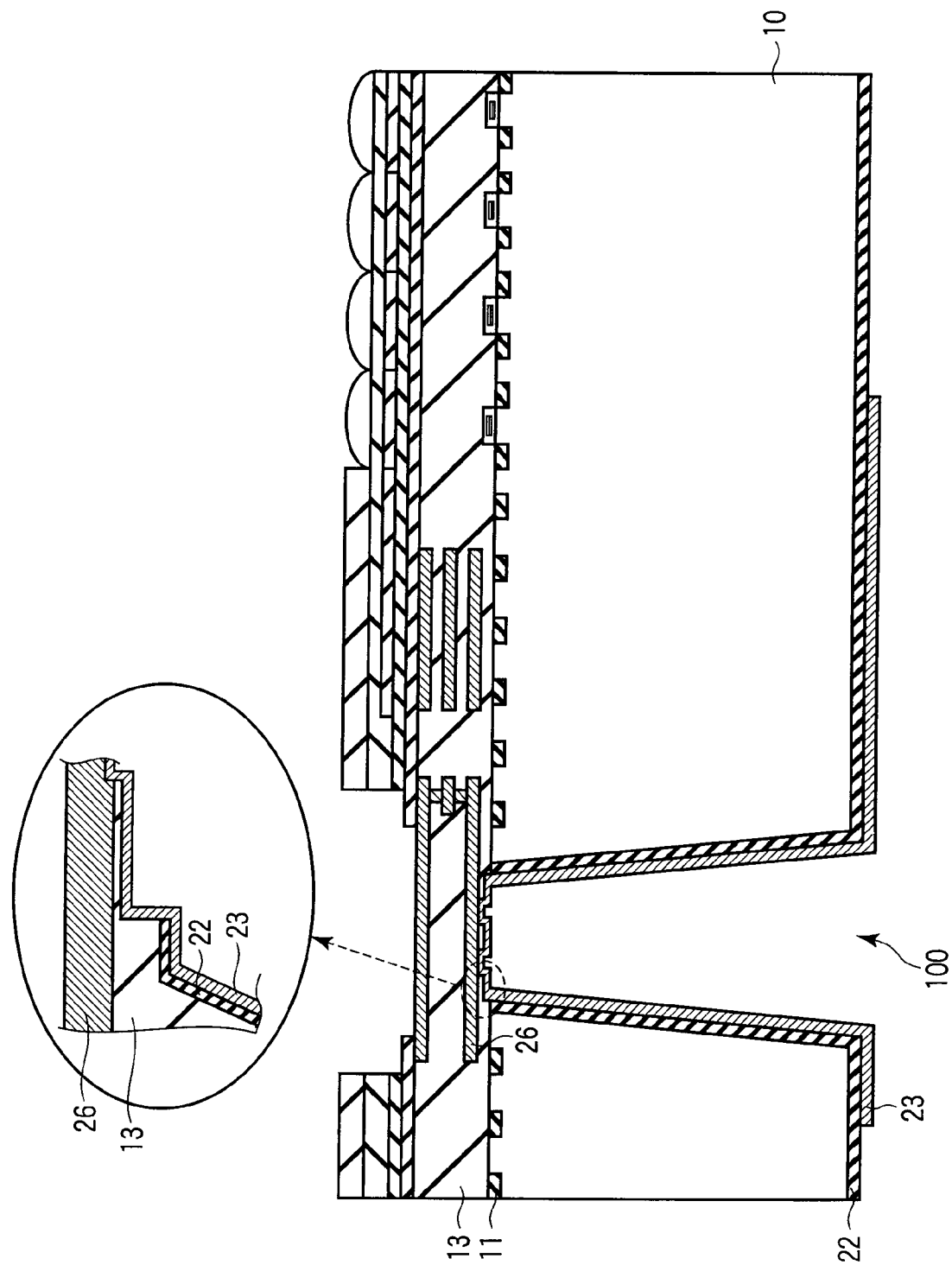
FIG. 18 is a cross-sectional view following FIG. 17 to explain a method of manufacturing a semiconductor device according to a fourth embodiment.

[FIG. 18, Steps S14 and S15]

The resist pattern 63 is removed by using a method such as a wet etching (step S14). The first and second metal seed layers (not shown) exposed by the removal of the resist pattern 63 are removed by etching (e.g., wet etching), so that the insulating film 22 on the area not covered with the conductor layer (through electrode and interconnect) 23 is exposed (step S15).

Figure 19:
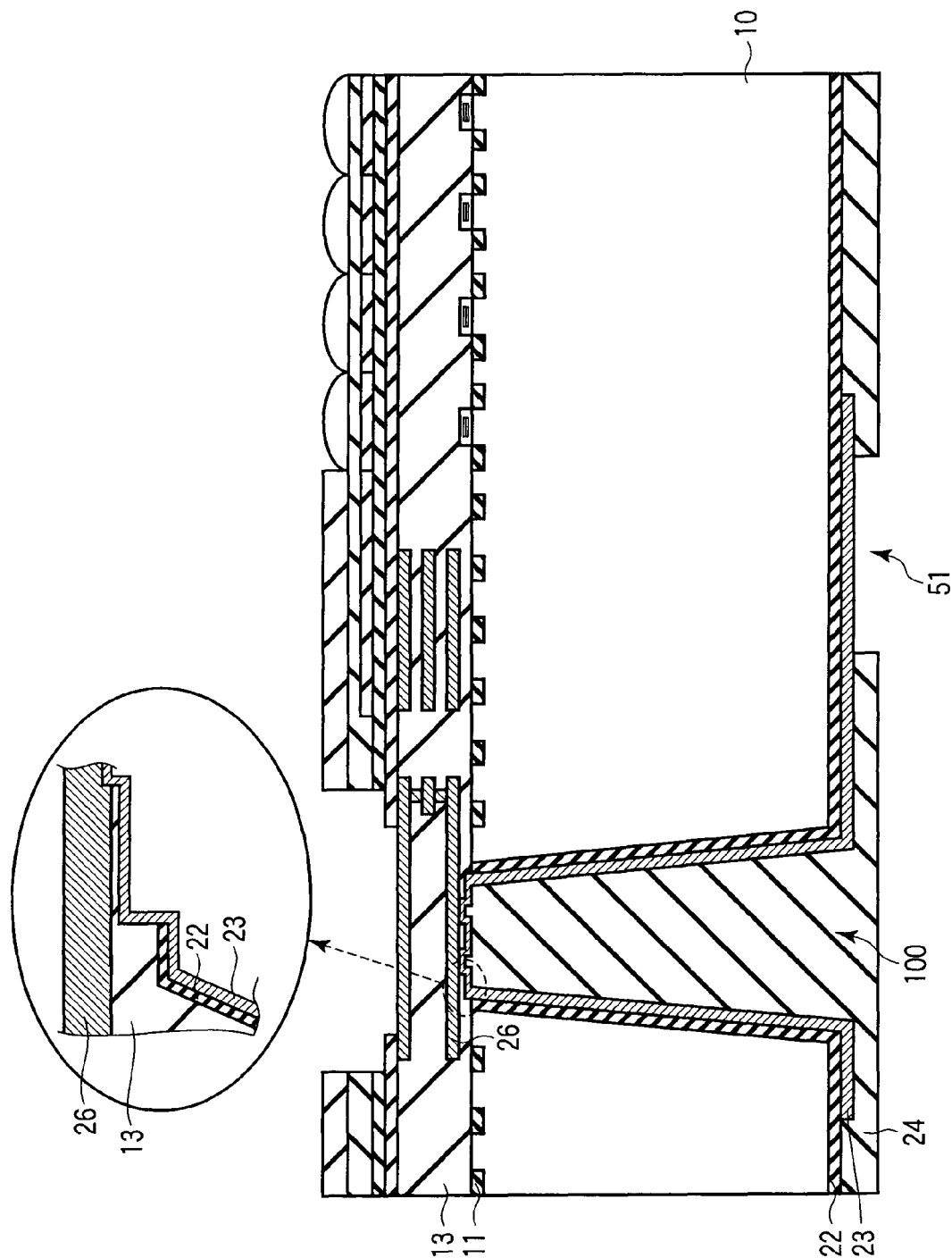
FIG. 19 is a cross-sectional view following FIG. 18 to explain a method of manufacturing a semiconductor device according to a fourth embodiment.

[FIG. 19, Step S16]

A solder resist 24 is formed on the entire second surface by spin coating, thereafter, by using lithography process, an opening 51 is formed in the solder resist 24 corresponding to the area on which a solder ball is to be attached.

Figure 20:
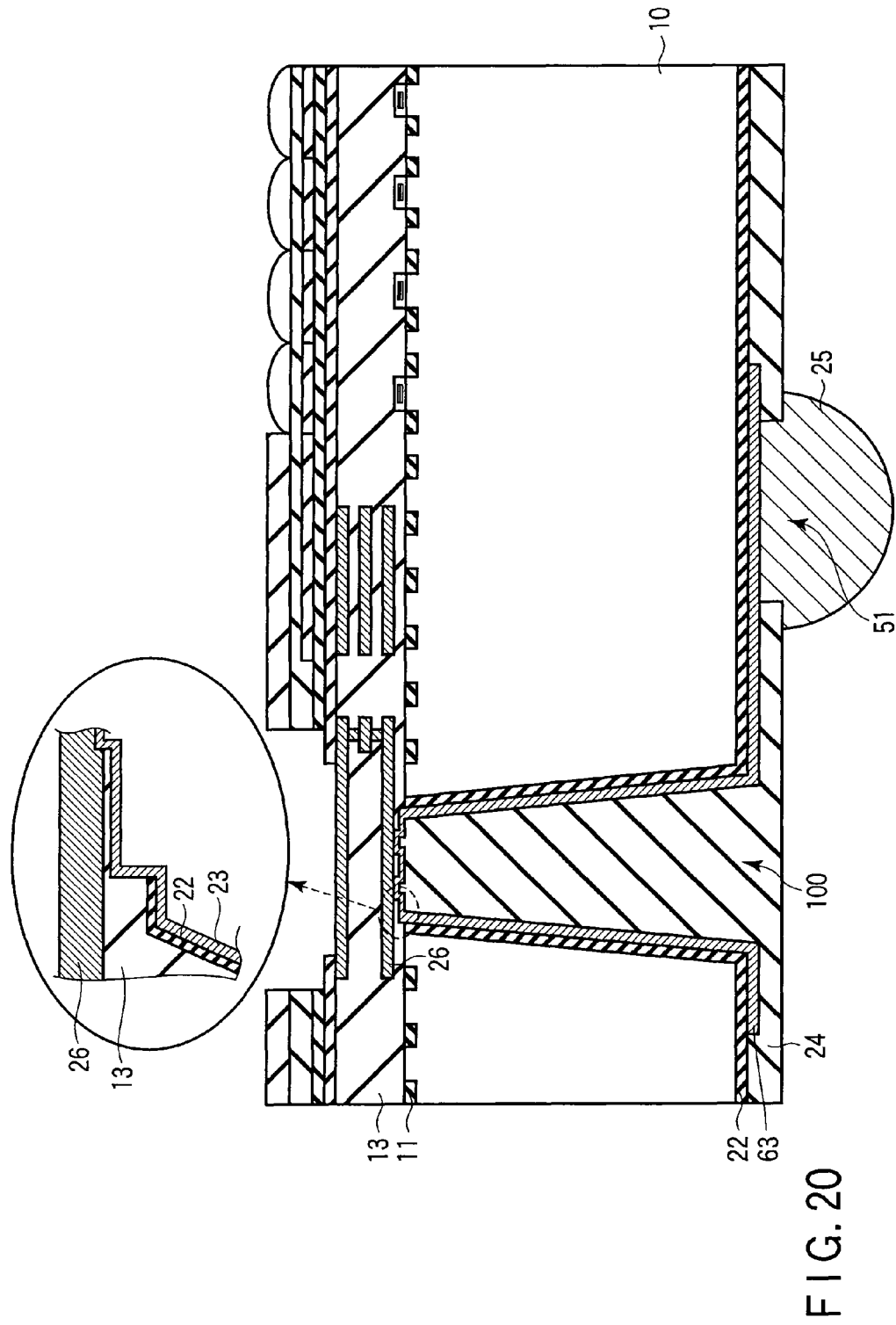
FIG. 20 is a cross-sectional view following FIG. 19 to explain a method of manufacturing a semiconductor device according to a fourth embodiment.

[FIG. 20, Steps S17 and S18]

A conduction check is made (step S17), and if the conduction is confirmed, the solder ball 25 is attached onto the conductor layer in the opening 51 (step S18). If the conduction is not confirmed, for example, a known repair processing is carried out.

Thereafter, the silicon substrate 10 is divided into individual pieces by dicing (step S19), and pickup (step S20), lens attachment (step S21) and image check (lens control) (step S22) are carried out.

Finally, after known steps including a step of packaging camera module (step S23) are performed, the manufacture of the semiconductor device including the camera module is finished.

Fifth Embodiment

Figure 21:
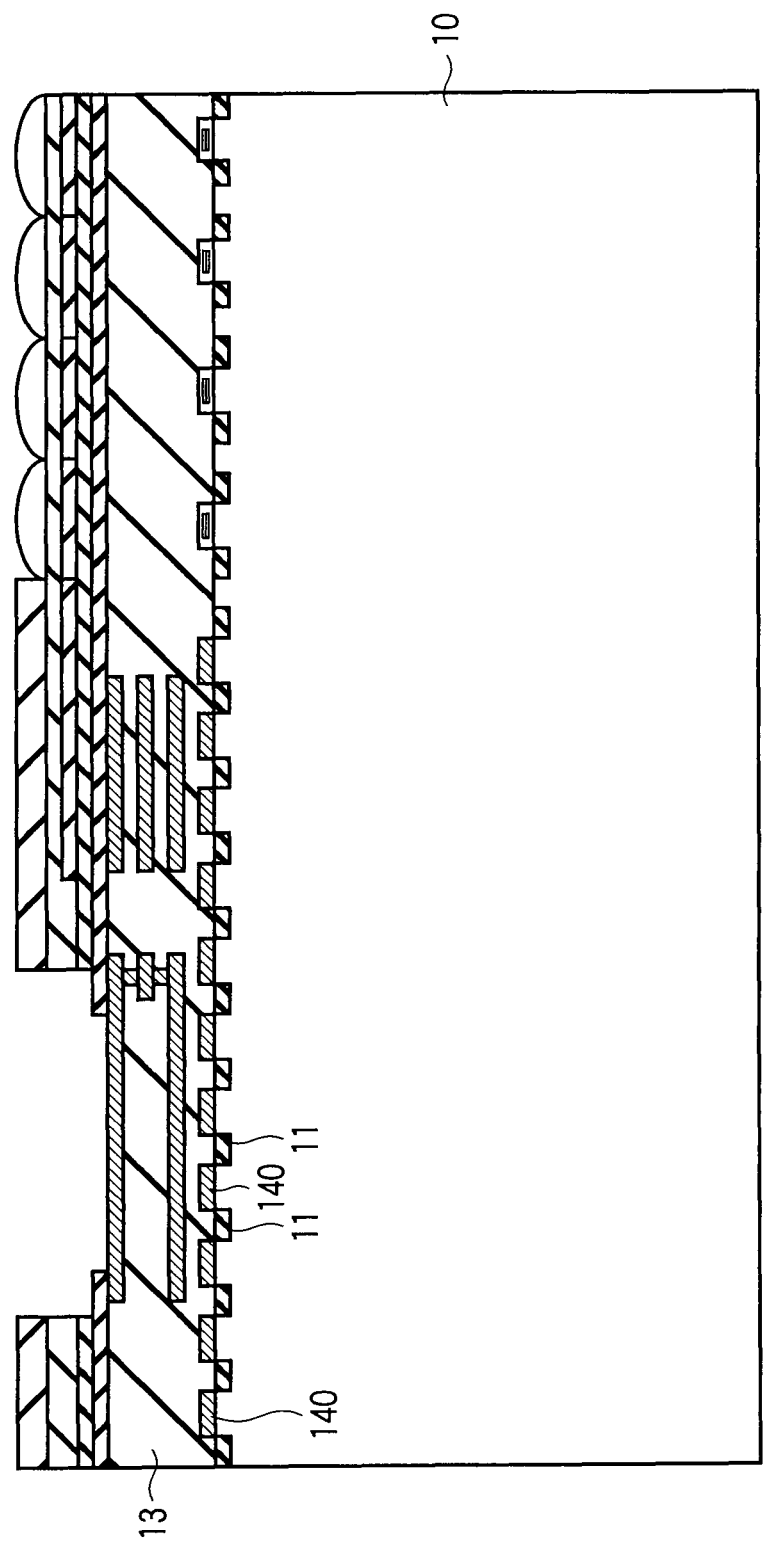
FIG. 21 is a cross-sectional view to explain method of manufacturing a semiconductor device according to a fifth embodiment.

According to the first to fourth embodiments, the dummy STI is formed in the surface of the silicon substrate of the pad area where the through hole is formed. In the present embodiment, a dummy gate electrode 140 formed of polycrystalline silicon is further formed as shown in FIG. 21. A thin gate oxide film (not shown) is formed under the dummy gate electrode 140. FIG. 21 is a cross-sectional view corresponding to FIG. 10 of the fourth embodiment.

According to the present embodiment, the dummy gate electrode 140 is provided on a silicon substrate (active area) between the dummy STIs 11. The dummy gate electrode 140 and dummy STI 11 are not overlapped. That is, the dummy gate electrode 140 has a size equal to an active area 150 formed between dummy STIs 11 as shown in FIG. 22, or has a size smaller than the active area 150 as shown in FIG. 23.

When the structure shown in FIG. 22 or FIG. 23 is employed, three layers of the silicon substrate 10, thin gate oxide film (not shown) and dummy gate electrode 140 are etched all at once, in the etching step for forming the through hole 100 (Si through hole etching) of step S7.

If the dummy gate electrode 140 is larger than the active area 150, and the dummy gate electrode 140 extends on the dummy STI 11, all of the dummy gate electrode 140 (Si component) is not etched by one-time Si through hole etching, and additional Si through hole etching is required to etch all of the dummy gate electrode 140, which is a disadvantage to increase the step of etching.

The manufacture method of the present embodiment uses two layers of dummy STI 11 and dummy gate electrode 140 for forming the concavo-convex structure of the insulating films. By using the concave portion and the convex portion, a part of the bottom surface of the through electrode in the through hole is connectable to the pad electrode, and not the whole bottom surface of the through electrode. Others are the same as the fourth embodiment.

Sixth Embodiment

Figure 24:
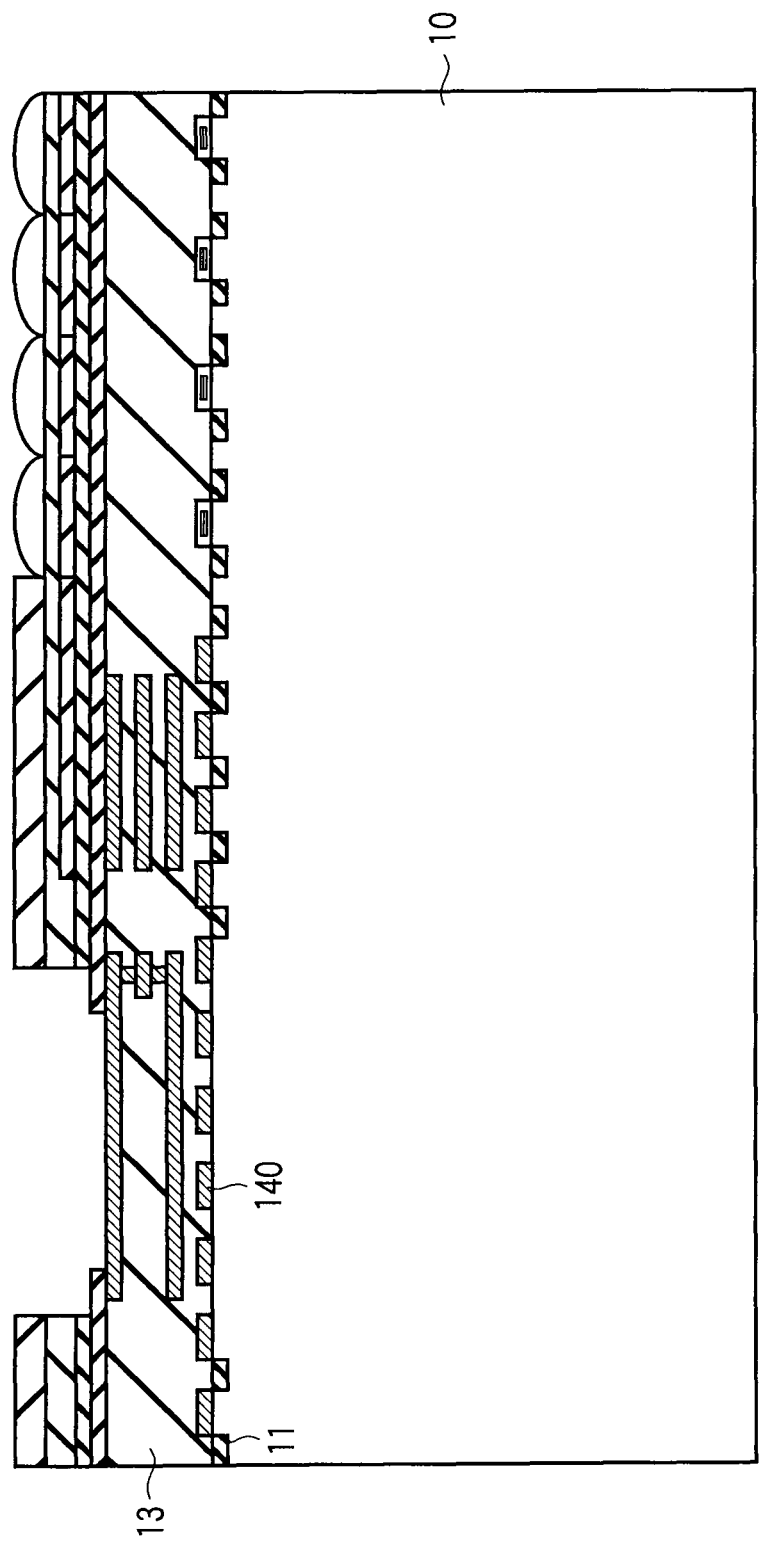
FIG. 24 is a cross-sectional view to explain method of manufacturing a semiconductor device according to a sixth embodiment.

A sixth embodiment differs from the fifth embodiment in the following point. As shown in FIG. 24, though the dummy gate electrode 140 is formed on the pad area of the silicon substrate, the dummy STI is not formed on it.

Even the present embodiment, the concavo-convex structure of the insulating film 22 is formed in the etching process for forming the through hole 100 in step S7, therefore, a part of the bottom surface of the through electrode in the through hole is connectable to the pad electrode, and not the whole bottom surface of the through electrode. Others are the same as the fourth embodiment.

The first to sixth embodiments relates to the semiconductor device including a camera module. The embodiments are applicable to a semiconductor device including a camera module using other camera module.

Figure 25:
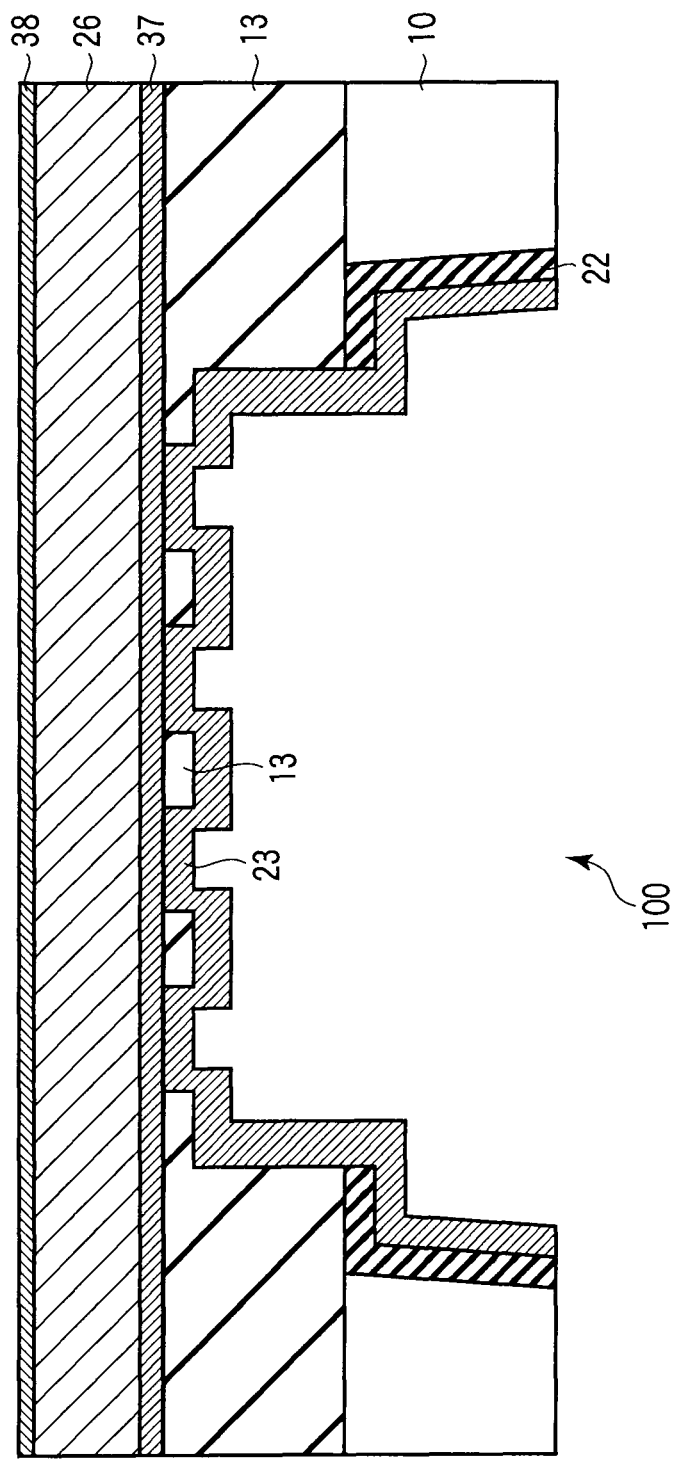
FIG. 25 is a cross-sectional view enlarging a bottom portion of a through hole according to other embodiment.

In addition, In FIG. 3, the protection internal electrode (protection electrode pad) 37 is provided so that a part of the lower surface of the internal electrode (electrode pad) 26 is exposed, but as shown in FIG. 25, the protection internal electrode 37 may be provided the whole lower surface of the internal electrode 26.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming an isolation region in a main surface of a semiconductor substrate, the isolation region comprising an isolation insulating film filling a trench formed in the main surface, and the isolation region being in a region where a through hole of the semiconductor substrate is to be formed and being in a region other than the region where the through hole is to be formed wherein the through hole passes through the main surface;
    forming an interlayer insulating film on the main surface;
    forming an electrode pad on the interlayer insulating film;
    forming the through hole by processing the semiconductor substrate and the interlayer insulating film such that a part of the electrode pad is exposed in the through hole and the interlayer insulating film is thinned in the through hole; and
    forming a through electrode in the through hole, wherein the through electrode contacts the exposed part of the electrode pad and the thinned interlayer insulating film.

2. The method according to claim 1, wherein the forming the isolation region comprises forming the trench in the main surface, forming an insulating film to be the isolation insulating film on the main surface, and polishing the insulating film by CMP process.

3. The method according to claim 1, wherein the region other than the region where the through hole is to be formed includes a region where a peripheral circuit is to be formed.

4. The method according to claim 1, further comprises filling the through hole with a protective film after forming the through electrode.

5. The method according to claim 4, wherein the protective film comprises a solder resist.

6. The method according to claim 1, further comprises forming a dummy electrode in the region where the through hole is to be formed, and wherein the dummy electrode is formed without overlapping with the isolation insulating film.

7. A method for manufacturing a semiconductor device, comprising:
    forming an isolation region in a main surface of a semiconductor substrate, the isolation region comprising an isolation insulating film filling a trench formed in the main surface, and the isolation region being in a region other than a region where a through hole of the semiconductor substrate is to be formed wherein the through hole passes through the main surface;
    forming a dummy electrode selectively in the region where the through hole is to be formed;
    forming an interlayer insulating film on the main surface;
    forming an electrode pad on the interlayer insulating film;
    forming the through hole by processing the semiconductor substrate, and the interlayer insulating film such that a part of the electrode pad is exposed in the through hole and the interlayer insulating film is thinned in the through hole; and
    forming a through electrode in the through hole, wherein the through electrode contacts the exposed part of the electrode pad and the thinned interlayer insulating film.

8. The method according to claim 7, wherein the forming the isolation region comprises forming the trench in the main surface, forming an insulating film to be the isolation insulating film on the main surface, and polishing the insulating film by CMP process.

9. The method according to claim 7, wherein the region other than the region where the through hole is to be formed includes a region where a peripheral circuit is to be formed.

10. The method according to claim 7, further comprises filling the through hole with a protective film after forming the through electrode.

* * * * *